(12) United States Patent
Furukawa et al.

(10) Patent No.: US 10,535,834 B2
(45) Date of Patent: Jan. 14, 2020

(54) TRANSPARENT ELECTRODE AND ELECTRONIC DEVICE

(71) Applicant: Konica Minolta, Inc., Tokyo (JP)

(72) Inventors: Shun Furukawa, Sagamihara (JP); Shigeru Kojima, Hino (JP); Kazuhiro Yoshida, Tachikawa (JP); Takeshi Hakii, Sagamihara (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/544,336

(22) PCT Filed: Feb. 1, 2016

(86) PCT No.: PCT/JP2016/052942
§ 371 (c)(1),
(2) Date: Jul. 18, 2017

(87) PCT Pub. No.: WO2016/136397
PCT Pub. Date: Sep. 1, 2016

(65) Prior Publication Data
US 2018/0013090 A1 Jan. 11, 2018

(30) Foreign Application Priority Data
Feb. 27, 2015 (JP) ................. 2015-037712

(51) Int. Cl.
*H01L 51/52* (2006.01)
*B32B 15/08* (2006.01)

(52) U.S. Cl.
CPC .......... *H01L 51/5215* (2013.01); *B32B 15/08* (2013.01); *B32B 2307/412* (2013.01); *B32B 2457/00* (2013.01)

(58) Field of Classification Search
CPC ............... H01L 51/5215; H05B 33/28; B32B 2307/412; B32B 7/02
See application file for complete search history.

(56) References Cited

U.S. PATENT DOCUMENTS

2012/0090685 A1* 4/2012 Forrest ............... B82Y 10/00
136/263
2013/0248842 A1* 9/2013 Gao ................ H01L 51/5215
257/40
(Continued)

FOREIGN PATENT DOCUMENTS

JP 2002015623 A 1/2002
JP 2006164961 A 6/2006
(Continued)

OTHER PUBLICATIONS

Lee et al. "A high performance transparent inverted organic light emitting diode with 1,4,5,8,9,11-hexaazatriphenylenehexacarbonitrile as an organic buffer layer" in Journal of Materials Chemistry vol. 22, p. 15262. Published by the Royal Society of Chemistry in 2012 (Year: 2012).*

(Continued)

*Primary Examiner* — Tuan A Hoang
(74) *Attorney, Agent, or Firm* — Lucas & Mercanti, LLP

(57) ABSTRACT

An object of the present invention is to provide a transparent electrode including a substrate having thereon a conductive layer containing silver as a main component, wherein the transparent electrode has an organic functional layer between the substrate and the conductive layer; and the organic functional layer contains a first organic compound represented by Formula (1) and a second organic compound having a different structure from a structure of the first organic compound, (Continued)

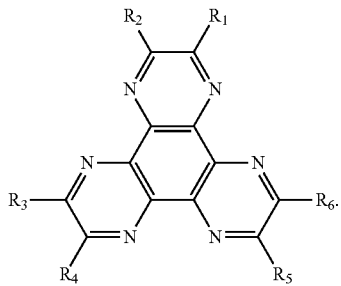

Formula (1)

4 Claims, 3 Drawing Sheets

(56) References Cited

U.S. PATENT DOCUMENTS

2013/0306951 A1* 11/2013 Zhou .................. H01L 51/5215
257/40
2014/0377546 A1* 12/2014 Ozeki .................. H05B 33/28
428/336

FOREIGN PATENT DOCUMENTS

JP         2009151963 A       7/2009
WO    WO-2013105569 A1 *  7/2013  ............. H05B 33/28
WO         2014188913 A1    11/2014

OTHER PUBLICATIONS

Office Action dated Jun. 5, 2018 from corresponding Chinese Patent Application No. 201680011315.3 and English translation.
International Preliminary Report on Patentability dated Apr. 19, 2016 from corresponding International Application No. PCT/JP2016/052942 and English translation.
International Search Report dated Apr. 19, 2016 for PCT/JP2016/052942 and English translation.
Office Action dated Feb. 19, 2008 from the corresponding Chinese Patent Application No. 201680011315.3 and English translation.
Office Action dated Feb. 19, 2019 from the corresponding Chinese Patent Application No. 201680011315.3 and English translation.
JPO, Notification of Reasons for Refusal from the corresponding Japanese Patent Application No. 2017-502015, dated Oct. 25, 2019, with English translation (5 pages).
CNIPA, Office Action for the corresponding Chinese patent application No. 201680011315.3, dated Aug. 27, 2019, with English translation (13 pages).

* cited by examiner

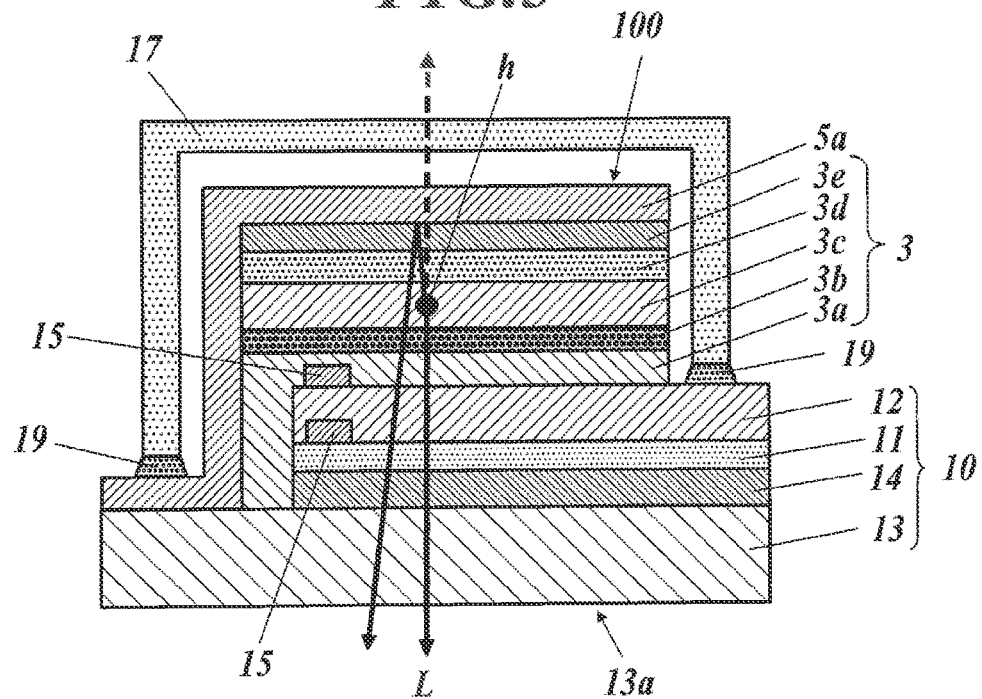
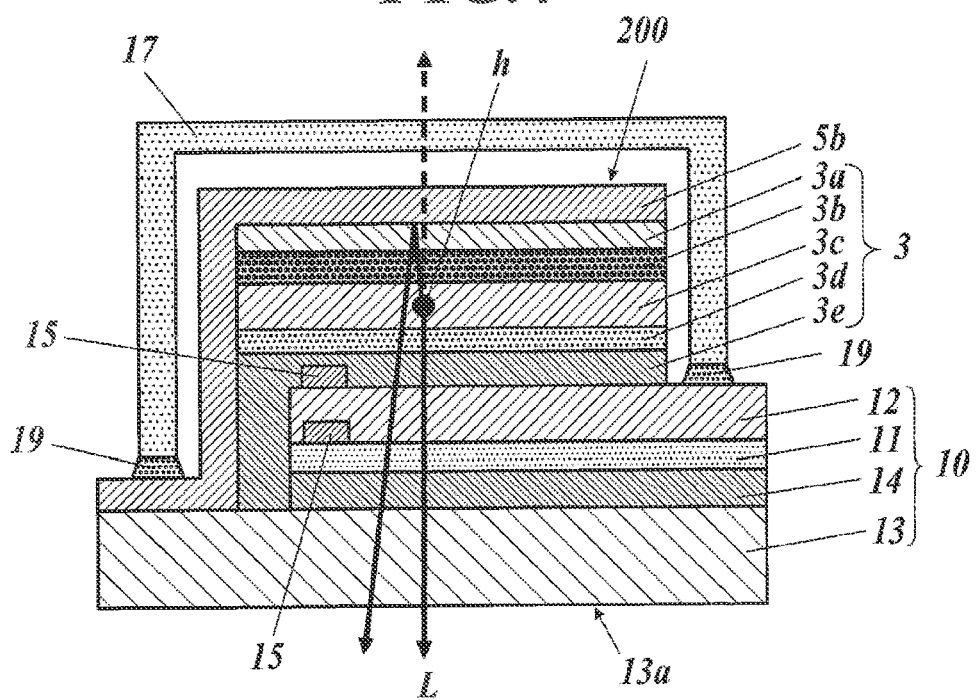

TRANSPARENT ELECTRODE AND ELECTRONIC DEVICE

CROSS REFERENCE TO RELATED APPLICATION

This application is a 371 of PCT/JP2016/052942 filed on Feb. 1, 2016, which, in turn, claimed the priority of Japanese Patent Application No. 2015-037712 filed on Feb. 27, 2015, both applications are incorporated herein by reference.

TECHNICAL FIELD

The present invention relates to a transparent electrode and an electronic device. More specifically, the present invention relates to a transparent electrode provided with both transparency and conductivity, and an electronic device equipped with this transparent electrode.

BACKGROUND

A transparent electrode is generally used for: a liquid crystal display, an electroluminescent display, a plasma display, an electrochromic display, a solar battery, a touch panel, and an electronic paper.

An organic EL element (it may be called as an organic-field light-emitting element), which utilizes electroluminescence (hereinafter, it is abbreviated as "EL") of an organic material, has a configuration of interposing a light emitting layer containing an organic compound between a pair of opposed electrodes. Emission light generated in the light emitting layer passes through the electrode and it is extracted to the outside. Therefore, at least one of the two electrodes is composed of a transparent electrode.

As for a transparent electrode, oxide semiconductor materials, such as indium tin oxide ($SnO_2$—$In_2O_3$: or abbreviation name ITO), are generally used. The transparent electrode made of ITO is usually produced with a sputtering method. The transparent electrode produced with a sputtering method only will have a large sheet resistance, and it exhibits remarkable voltage decrease from the power supplying point.

In order to decrease a sheet resistance, it was investigated a method of laminating an ITO layer and a silver layer for reducing resistance (for example, refer to Patent documents 1 and 2).

Patent document 1 discloses a transparent electrode having a structure of laminating an ITO film and a silver film. Patent document 2 discloses a transparent electrode having a structure of interposing a silver film with ITO films. However, when the used silver film was made thin to an extent of not inducing loss of light transmittance, the resistance did not sufficiently decrease. Therefore, it was required to combine with a metal oxide such as ITO. Since ITO employs a rare earth metal In, the cost of material is high. In addition, it is required to perform an annealing treatment at a temperature condition of around 300° C. for decreasing the resistance. It was difficult to use a resin substrate at such temperature condition. When silver was employed, high electric conductivity is obtained. On the other hand, it has a problem of trade-off between resistance and light transmittance.

Patent document 3 proposes the structures for replacing a metal oxide such as ITO. One structure contains a thin film metal material such as silver having high electric conductivity. The other structure contains a mixture of silver with aluminum. This mixture enabled to achieve higher electric conductivity with a thinner film than silver. However, a transparent electrode composed of silver and aluminum having high electric conductivity had slightly insufficient sheet resistance. A metal thin film is usually is required to have a large thickness to increase sheet resistance. Consequently, light transmittance will be deteriorated. As described above, the resistance property and the light transmittance are in a trade-off relationship. It was difficult to achieve sufficient conductivity and light transmittance at the same time. Further, in a silver-aluminum alloy, aluminum has a property of easily oxidized. It has a problem of increasing the resistance by oxidization. Therefore, it has been required a transparent electrode enabling to achieve both resistance (conductivity) and light transmittance.

PRIOR ART DOCUMENTS

Patent Documents

Patent document 1: JP-A 2002-015623

Patent document 2: JP-A 2006-164961

Patent document 3: JP-A 2009-151963

SUMMARY OF THE INVENTION

Problems to be Solved by the Invention

The present invention has been made in view of the above-described problems and situation. An object of the present invention is to provide a transparent electrode provided with both excellent transparency and high conductivity, and an electronic device equipped with this transparent electrode with low driving voltage and excellent in color shift stability.

Means to Solve the Problems

The present inventors have investigated the cause of the above-described problems in order to solve the problems. As a result, it was found to achieve a transparent electrode provided with both excellent transparency and high conductivity by a transparent electrode having an organic functional layer interposed between a substrate and a conductive layer composed of silver as a main component, the organic functional layer containing two kinds of organic compounds each having a specific structure. Thus, the present invention has been achieved.

That is, the above-described problems of the present invention are solved by the following embodiments.

1. A transparent electrode comprising a substrate having thereon a conductive layer containing silver as a main component, wherein the transparent electrode has an organic functional layer between the substrate and the conductive layer; and the organic functional layer contains a first organic compound represented by Formula (1) and a second organic compound having a different structure from a structure of the first organic compound.

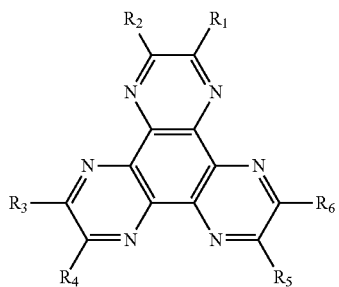

Formula (1)

wherein $R_1$ to $R_6$ each independently represent: a hydrogen atom, a halogen atom, a cyano group, a nitro group, a sulfonyl group (—$SO_2R^7$), a sulfinyl group (—$SOR^7$), a sulfonamide group (—$SO_2NR^7R^8$), a sulfonate group (—$SO_3R^7$), a trifluoromethyl group, an ester group (—$COOR^7$), an amide group (—$CONHR^7$ or —$CONR^7R^8$), an alkyl group of 1 to 12 carbon atoms, an alkoxy group of 1 to 12 carbon atoms, an aromatic hydrocarbon ring group, an arylamino group, a non-aromatic heterocyclic group, an aromatic heterocyclic group, or an aralkylamino group; $R^7$ and $R^8$ each independently represent an alkyl group of 1 to 60 carbon atoms, an aryl group, or a 5 to 7 membered heterocyclic group.

2. The transparent electrode described in the embodiment 1, wherein the second organic compound contained in the organic functional layer is a compound represented by Formula (2) or Formula (3).

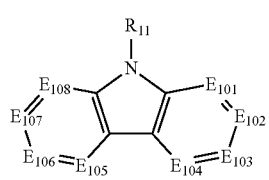

Formula (2)

wherein $E_{101}$ to $E_{108}$ each represent $C(R_{12})$ or a nitrogen atom, and at least one of $E_{101}$ to $E_{108}$ represents a nitrogen atom; and $R_{11}$ and $R_{12}$ each represent a hydrogen atom or a substituent,

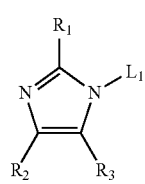

Formula (3)

wherein $R_1$, $R_2$, and $R_3$ each independently represent a hydrogen atom or a substituent; and $L_1$ represents an aromatic hydrocarbon ring group or an aromatic heterocyclic group bonded to a nitrogen atom.

3. The transparent electrode described in embodiments 1 or 2, wherein the first organic compound represented by Formula (1) has $R_1$ to $R_6$ all being a cyano group.

4. The transparent electrode described in any one of embodiments 1 to 3, wherein the transparent electrode has an optical adjusting layer containing a metal oxide or a metal sulfide between the substrate and the organic functional layer.

5. An electronic device provided with the transparent electrode described in any one of embodiments 1 to 4.

6. The electronic device described in embodiment 5 being an organic electroluminescent element.

Effects of the Invention

The present invention may provide a transparent electrode provided with both excellent transparency and high conductivity, and the present invention may provide an electronic device equipped with this transparent electrode achieving low driving voltage and excellent color shift stability.

A formation mechanism or an action mechanism of the effects of the present invention is not clearly identified, but it is supposed as follows.

Generally, when it is produced a transparent electrode provided with sufficient conductivity and transparency by a conductive layer composed of silver as a main component, formation of a uniform thin layer is required so that the conductive layer works as an electrode. Consequently, it is necessary to make a condition of preventing formation of a non-uniform layer caused by aggregation.

However, silver atoms make thin film growth in the nucleus growth mode (Volumer-Weber (VW) mode) in general. Therefore, silver atoms are easily isolated in the shape of islands. As a result, it is difficult to obtain large conductivity when the film thickness is small, and the sheet resistance will become high. Consequently, the film thickness is required to be large for securing conductivity. The large film thickness leads to decrease of light transmittance. It was difficult to obtain a transparent electrode achieving both conductivity and light transmittance.

The present inventors found the following. By forming an organic functional layer containing a first organic compound represented by Formula (1) and a second organic compound having a different structure from a structure of the first organic compound on a substrate, or on an optical adjusting layer disposed on a substrate when needed, the conductive layer containing silver as a main component becomes to form a uniform film.

Namely, in the present invention, by using a second organic compound combined with a first organic compound represented by Formula (1) having high affinity with silver, each component of the organic functional layer will be placed in a random arrangement in the layer. That is, the component is not localized in the layer and it is placed in a uniform distribution state. As a result, the conductive layer formed on the organic functional layer becomes a continuous silver film. By forming an organic functional layer containing a first organic compound represented by Formula (1) and a second organic compound, the silver atoms will form a two-dimensional core on the organic functional layer containing a silver-affinity compound having an atom exhibiting affinity with silver atoms. A single crystal layer is formed around the two-dimensional core by film growth in the layer growth mode (Frank-van der Mere (FW) mode).

Otherwise, it is supposed as follows. By a regular array of the first organic compound represented by Formula (1), the second organic compound is also placed in a regular array to some extent. Thereby, the portion having affinity with silver will be efficiently formed on the surface.

BRIEF DESCRIPTION OF THE DRAWINGS

FIG. 3 is a schematic cross-sectional view illustrating an example (a first embodiment) of a structure of an organic EL element being an electronic device employing a transparent electrode of the present invention.

FIG. 4 is a schematic cross-sectional view illustrating another example (a second embodiment) of a structure of an organic EL element being an electronic device employing a transparent electrode of the present invention.

EMBODIMENTS TO CARRY OUT THE INVENTION

The transparent electrode of the present invention comprises a substrate having thereon a conductive layer containing silver as a main component. It is characterized in that the transparent electrode has an organic functional layer between the substrate and the conductive layer; and the organic functional layer contains a first organic compound represented by Formula (1) and a second organic compound having a different structure from a structure of the first organic compound. These features are technical features commonly owned by the invention according to the above-described embodiments 1 to 6.

From the viewpoint of obtaining the effects of the present invention, a preferable embodiment of the present invention is that the second organic compound contained in the organic functional layer is a compound represented by Formula (2) or Formula (3). By combining this compound with the first organic compound represented by Formula (1), it may form a conductive layer having a high continuity and excellent light transmittance.

It is preferable that the first organic compound represented by Formula (1) has $R_1$ to $R_6$ all being a cyano group (hereafter, it may be abbreviated as HAT-CN). By this, it may form a conductive layer containing silver as a main component, and it may obtain a transparent electrode provided with high continuity and excellent in resistance property.

From the viewpoint of enabling to adjust optical properties such as reflectivity and light transmittance of the conductive layer, and to further improve the light transmittance of the transparent electrode, a preferable embodiment is that he transparent electrode has an optical adjusting layer containing a metal oxide or a metal sulfide between the substrate and the organic functional layer.

A transparent electrode of the present invention may be used for a transparent electrode of an electronic device such as organic electroluminescent element. Thereby the electronic device may be driven with a low voltage, and color shift during light emission may be prevented.

The present invention and the constitution elements thereof, as well as configurations and embodiments, will be detailed in the following. In the present description, when two figures are used to indicate a range of value before and after "to", these figures are included in the range as a lowest limit value and an upper limit value.

«Transparent Electrode»

[Basic Structure of Transparent Electrode]

A basic structure of a transparent electrode of the present invention will be described by referring to FIG. 1, FIG. 2A, and FIG. 2B.

Figure 1:
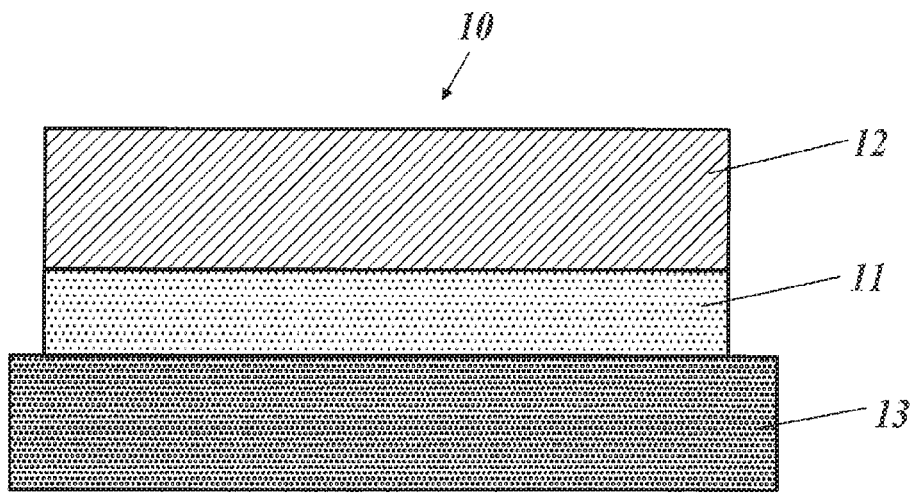
FIG. 1 is a schematic cross-sectional view illustrating an example of a structure of a transparent electrode of the present invention.

FIG. 1 is a schematic cross-sectional view illustrating an example (a first embodiment) of a structure of a transparent electrode of the present invention.

As illustrated in FIG. 1, a transparent electrode (10) of the present invention contains a substrate (13) having thereon a conductive layer (12) containing silver as a main component. The transparent electrode has an organic functional layer (11) between the substrate (13) and the conductive layer (12), and the organic functional layer (11) contains a first organic compound represented by Formula (1) and a second organic compound having a different structure from a structure of the first organic compound.

Figure 2A:
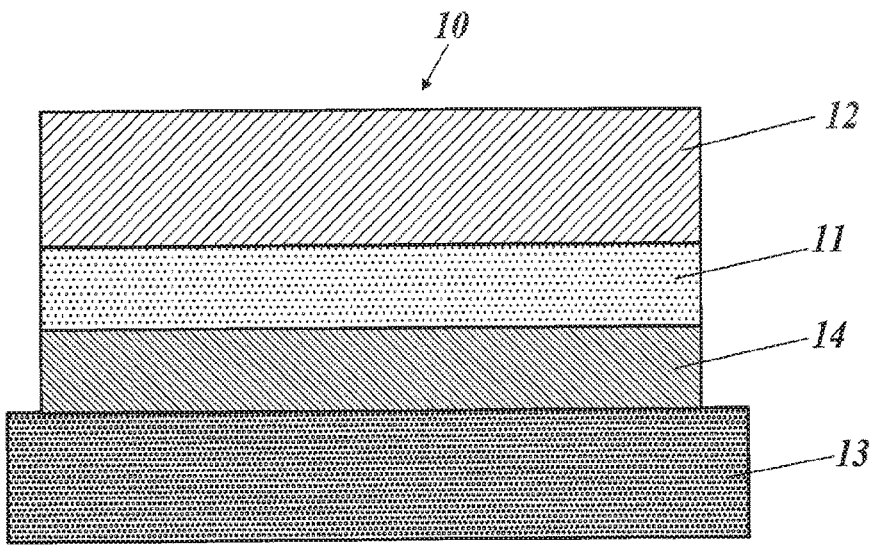
FIG. 2A is a schematic cross-sectional view illustrating another example of a structure of a transparent electrode of the present invention.
Figure 2B:
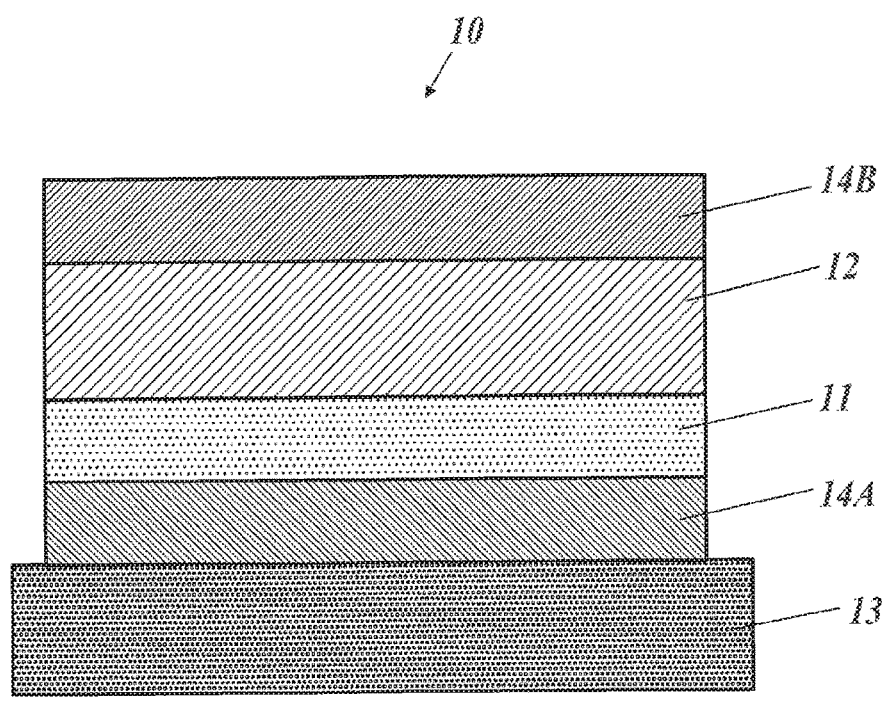
FIG. 2B is a schematic cross-sectional view illustrating another example of a structure of a transparent electrode of the present invention.

FIG. 2A and FIG. 2B are a schematic cross-sectional view illustrating another example (a second embodiment) of a structure of a transparent electrode of the present invention.

A transparent electrode (10) illustrated in FIG. 2A has further an optical adjusting layer (14) containing a metal oxide or a metal sulfide between the substrate (13) and the organic functional layer (11) to the constitution described in FIG. 1. A transparent electrode (10) illustrated in FIG. 2B has further a second optical adjusting layer (14B) on the outermost surface of the conductive layer (12) to the constitution described in FIG. 2A.

"A main component" of the conductive layer (12) of the present invention indicates a component having the highest ratio among components constituting the conductive layer (12). When a conductive layer contains "silver as a main component", it indicates that the constituting ratio of silver is 51 mass % or more, preferably 60 mass % or more, and more preferably 90 mass % or more, still more preferably 98 mass % or more.

The "transparent" used in the transparent electrode (10) indicates the state having light transmittance at measuring wavelength of 550 nm is 50% or more.

A preferable sheet resistance of the transparent electrode (10) is less than 8Ω/□, and a thickness of the conductive layer (12) is usually set to be in the range of 5 to 20 nm, preferably in the range of 5 to 12 nm.

[Main Constitution of Transparent Electrode]

Next, it will be detailed a substrate (13), an organic functional layer (11), and a conductive layer (14) that constitute a transparent electrode (10) of the present invention.

[Substrate]

The substrate (13) on which the transparent electrode (10) of the present invention is formed is, for example, glass or plastic, but not limited thereto. When the transparent electrode (10) of the present invention is used for an electronic device such as an organic EL element which extracts light from the substrate (13) side, it is preferable that the substrate (13) is transparent. Examples of the transparent substrate (13) used by preference include glass, quartz and a transparent resin film.

A thin film glass may be used as glass. As a thin film glass, it may be used glass made by various producing methods. It may be used glass made of methods of: a roll out method, a redraw method, a down draw method, and a float method.

An average thickness of a thin film glass is preferably 5 to 200 μm, more preferably 5 to 100 μm. A thin film glass is not limited in particular, as long as it is a multi-component oxide glass. Examples of the glass include silica glass, soda-lime silica glass, lead glass, borosilicate glass and alkali-free glass. On the surface of any of these glass materials a physical treatment, such as polishing, may be carried out, as needed, in view of adhesion to the organic functional layer (11) or the optical adjusting layer (14), durability and evenness. It may be formed a coating composed of an inorganic matter or an organic matter, or a hybrid coating composed of these.

Examples of a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyallylates and cycloolefin resins such as ARTON (trade name, made by JSR Co. Ltd.) and APEL (trade name, made by Mitsui Chemicals, Inc.).

On the surface of the above-described resin film, it may be formed a film incorporating an inorganic or an organic compound or a hybrid film incorporating both compounds. Barrier films are preferred with a water vapor permeability of 0.01 g/m²·24 h or less (at 25±0.5° C., and 90±2% RH) determined based on JIS K 7129-1992. Further, high barrier films are preferred to have an oxygen permeability of $1\times10^{-3}$ ml/m²·24 h·atm or less determined based on JIS K 7126-1987, and a water vapor permeability 1 of $1\times10^{-5}$ g/m²·24 h or less.

As materials that form a gas barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Gas barrier film forming methods are not particularly limited. Examples of employable methods include a vacuum deposition method, a sputtering method, a reactive sputtering method, a molecular beam epitaxy method, a cluster ion beam method, an ion plating method, a plasma polymerization method, a plasma. CVD method, a laser CVD method, a thermal CVD method, and a coating method.

[Organic Functional Layer]

An organic functional layer according to the present invention is disposed between the substrate and the conductive layer containing silver as a main component. It is a layer to make a metal atom array in the conductive layer to be uniform, and to achieve a good balance between light transmittance and resistance. It is characterized in that it contains a first organic compound represented by Formula (1) described layer and a second organic compound having a different structure from a structure of the first organic compound. A preferable embodiment is that the second organic compound is a compound represented by Formula (2) or Formula (3).

(Compound Having Structure Represented by Formula (1))

First, a compound having structure represented by Formula (1) being a first organic compound will be described. Hereafter, it is called as "Compound represented by Formula (1)".

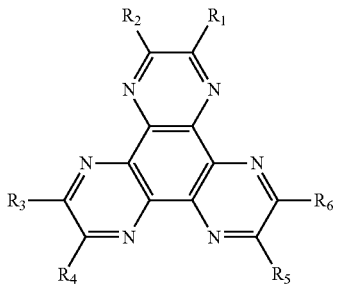

Formula (1)

In Formula (1), $R_1$ to $R_6$ each independently represent: a hydrogen atom, a halogen atom, a cyano group, a nitro group, a sulfonyl group ($-SO_2R^7$), a sulfinyl group ($-SOR^7$), a sulfonamide group ($-SO_2NR^7R^8$), a sulfonate group ($-SO_3R^7$), a trifluoromethyl group, an ester group ($-COOR^7$), an amide group ($-CONHR^7$ or $-CONR^7R^8$), an alkyl group of 1 to 12 carbon atoms, an alkoxy group of 1 to 12 carbon atoms, an aromatic hydrocarbon ring group, an arylamino group, a non-aromatic heterocyclic group, an aromatic heterocyclic group, or an aralkylamino group; $R^7$ and $R^8$ each independently represent an alkyl group of 1 to 60 carbon atoms, an aryl group, or a 5 to 7 membered heterocyclic group.

$R_1$ to $R_6$ and $R^7$ to $R^8$ in Formula (1) each may have a substituent. Examples of a substituent include: a straight or a branched alkyl group (for example, a methyl group, an ethyl group, a propyl group, an isopropyl group, a t-butyl group, a pentyl group, a hexyl group, an octyl group, a dodecyl group, a tridecyl group, a tetradecyl group, and a pentadecyl group); an alkenyl group (for example, a vinyl group, and an allyl group); an alkynyl group (for example, an ethynyl group and a propargyl group); an aromatic hydrocarbon group (also called an aromatic carbon ring group or an aryl group, for example, a group derived from a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, an indene ring, a fluorene ring, a fluoranthene ring, a naphthacene ring, a pentacene ring, a perylene ring, a pentaphene ring, a picene ring, a pyrene ring, a pyranthrene ring, an anthanthrene ring, or a tetralin ring); an aromatic heterocyclic group (for example, a group derived from a furan ring, a dibenzofuran ring, a thiophene ring, a dibenzothiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, thiazole ring, an indole ring, an indazole ring, a benzimidazole ring, a benzothiazole ring, a benzoxazole ring, a quinoxaline ring, quinazoline ring, cinnoline ring, a quinoline ring, an isoquinoline ring, a phthalazine ring, a naphthyridine ring, a carbazole ring, a carboline ring, or a diazacarbazole ring (indicating a ring structure in which one of the carbon atoms constituting the carboline ring is replaced with nitrogen atoms).

A carboline ring and a diazacarbazole ring both may be called as an azacarbazole ring. Examples further include: a non-aromatic hydrocarbon ring group (for example, a cyclopentyl group, and a cyclohexyl group); a non-aromatic heterocyclic ring group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycathonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group).

Examples further include: an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocathonyl group, a propylaminocarbonyl group, a pentylaminocarbonyl group, a cyclohexylaminocarbonyl group, an octylaminocathonyl group, a 2-ethymexylaminocathonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group), an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group), and a deuterium atom.

Representative examples of a compound represented by Formula (1) are indicated in the following. However, the present invention is not limited to them.

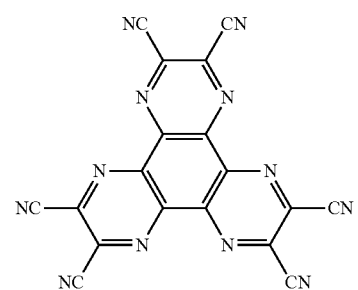

1-1

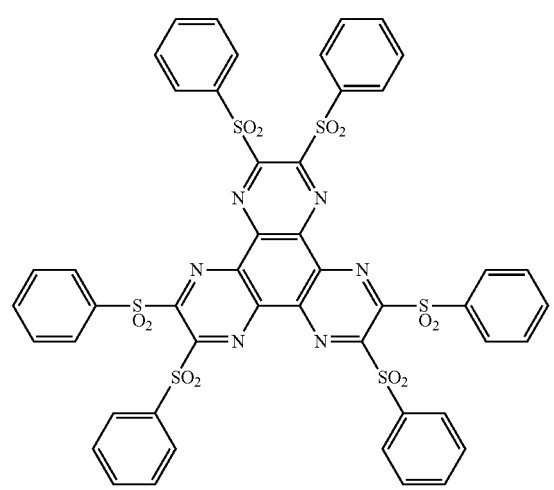

1-2

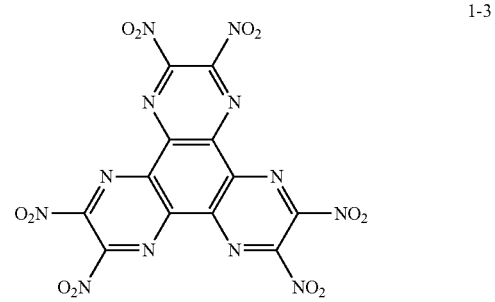

1-3

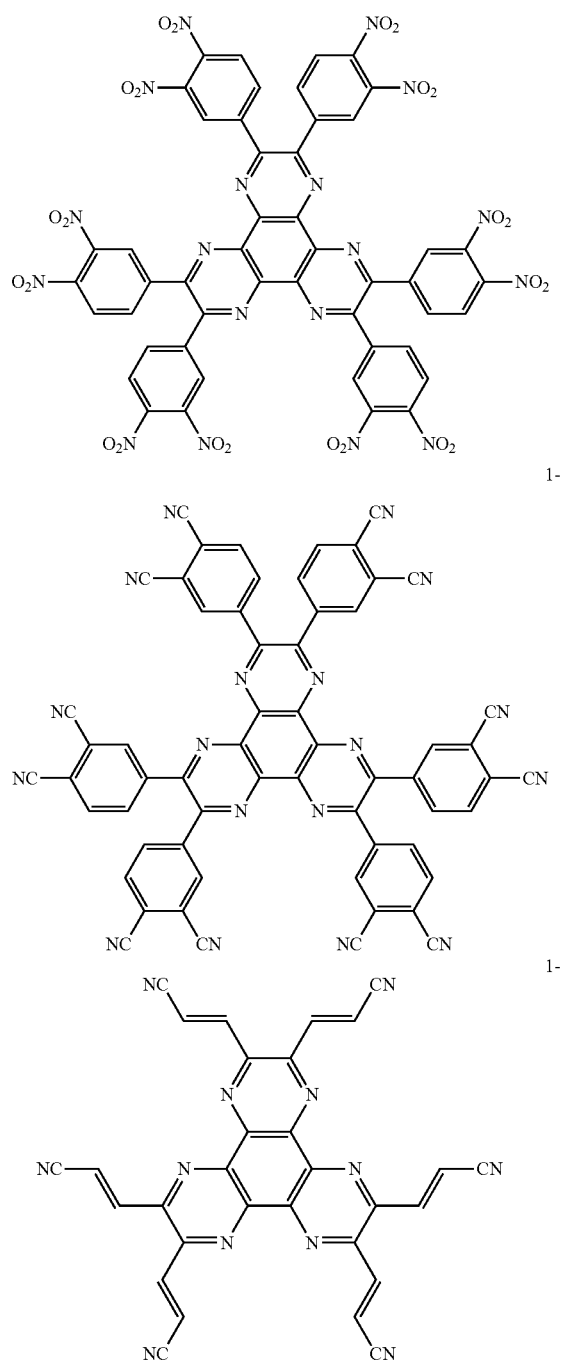

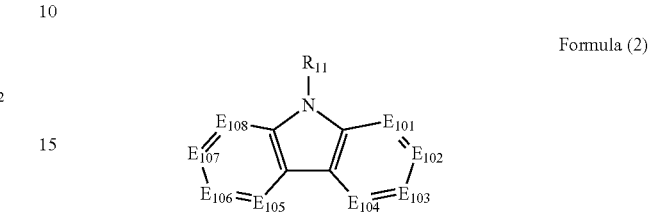

In the present invention, an exemplary compound (1-1) having $R_1$ to $R_6$ all to be a cyano group is particularly preferable among the compounds represented by Formula (1). This exemplary compound (1-1) is referred to as an abbreviation of "HAT-CN".

The compounds represented by Formula (1) may be easily obtained by synthesizing in accordance with the known preparation methods.

(Second Organic Compound)

An organic functional layer according to the present invention is characterized in that it contains a first organic compound represented by Formula (1) and a second organic compound used together. It is preferable that the second organic compound is a compound represented by Formula (2) or Formula (3).

(Compound Having Structure Represented by Formula (2))

It is preferable that a second organic compound according to the present invention is a compound having structure represented by Formula (2). Hereafter, it is called as "Compound represented by Formula (2)".

In Formula (2), $E_{101}$ to $E_{108}$ each represent $C(R_{12})$ or a nitrogen atom, and at least one of $E_{101}$ to $E_{108}$ represents a nitrogen atom; and $R_{11}$ and $R_{12}$ each represent a hydrogen atom or a substituent.

Examples of a substituent represented by $R_{11}$ and $R_{12}$ include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group, an allyl group); an alkynyl group (for example, an ethynyl group and a propargyl group); an aromatic hydrocarbon group (also called an aromatic hydrocarbon ring, an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyl group); an aromatic heterocyclic group (for example, a pyridyl group, a pyrazyl group, a pyrimidinyl group, a triazyl a group, a furyl group, a pyrrolyl group, an imidazolyl group, a benzimidazolyl group, a pyrazolyl group, a pyrazinyl group, a triazolyl group (for example, 1,2,4-triazol-1-yl group, and 1,2,3-triazol-1-yl group), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, an azacarbazolyl group (indicating a ring structure in which one of the carbon atoms constituting the carbazole ring of the carbazolyl group is replaced with nitrogen atoms), a quinoxalinyl group, a pyridazinyl group, a triazinyl group, a quinazolinyl group, and a phthalazinyl group); a heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an acyloxy group (for example, a phenoxy group and a naphthyloxy group); an alkylthio group (for example, a methylthio group, an ethylthio group, a propylthio group, a pentylthio group, hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethyl carbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group); an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group) and a phosphono group.

A part of these substituents may be further substituted with the above-described substituents. In addition, a plurality of these substituents may be bonded together to form a ring.

Specific examples of a compound represented by Formula (2) according to the present invention are indicated below. However, the present invention is not limited to these exemplary compounds.

2-1

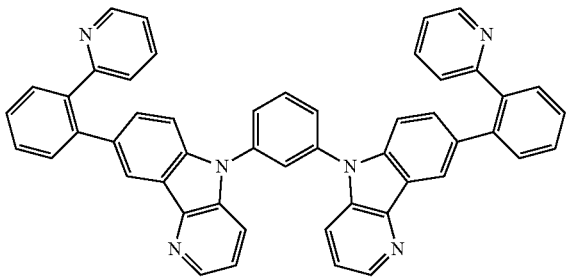

2-2

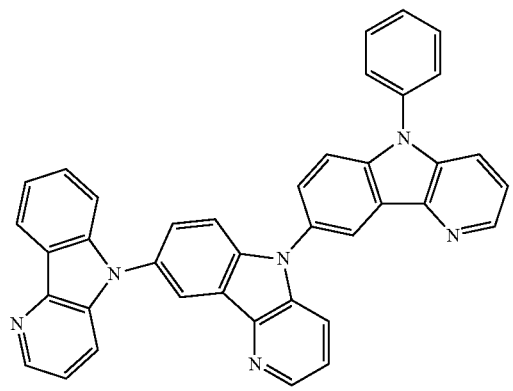

2-3

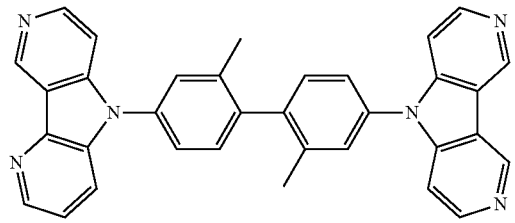

2-5

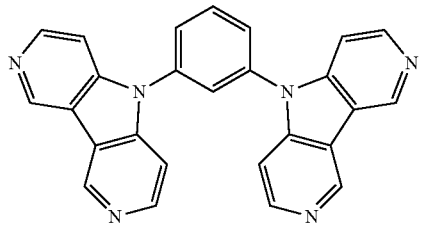

2-6

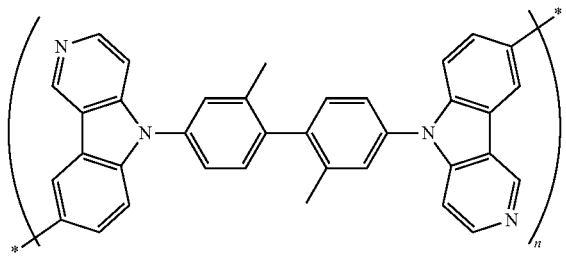

2-7
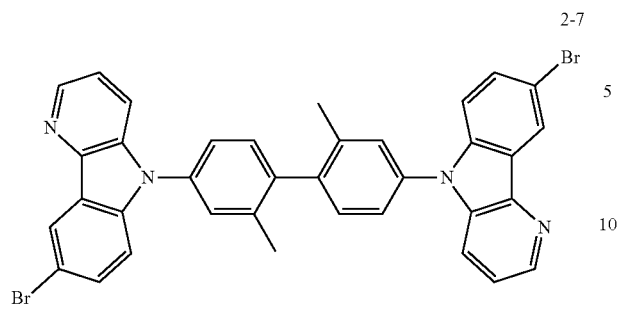

2-13
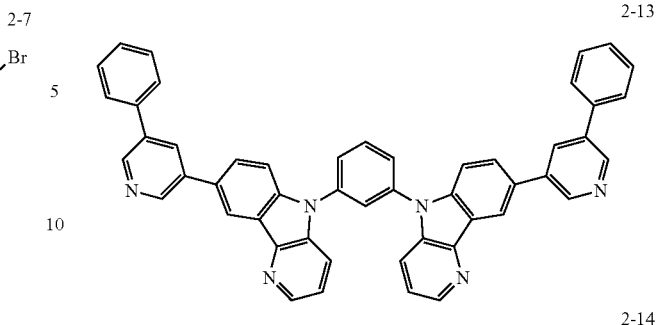

2-8
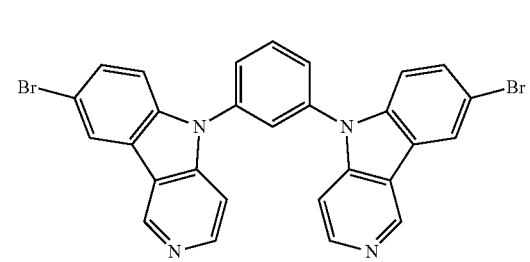

2-14
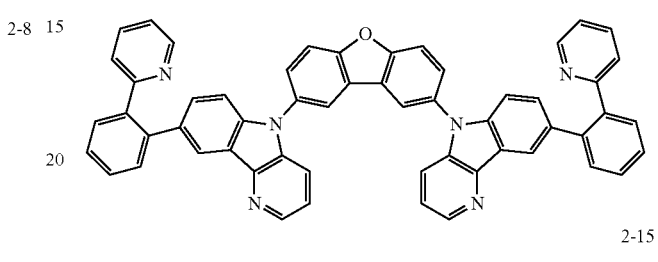

2-9
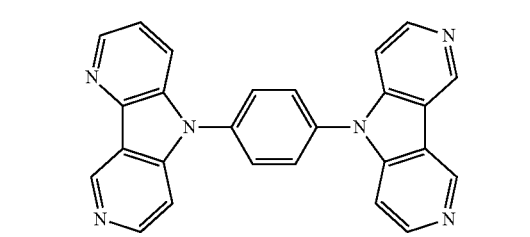

2-15
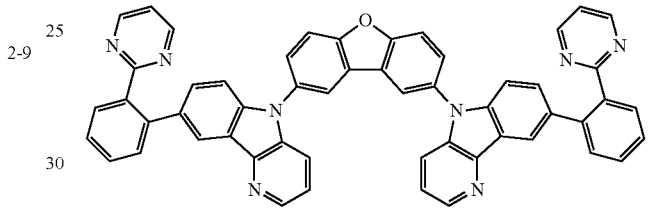

2-10
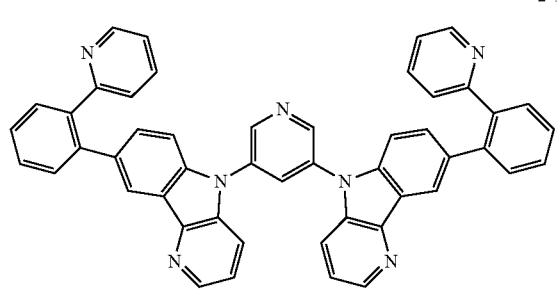

2-16
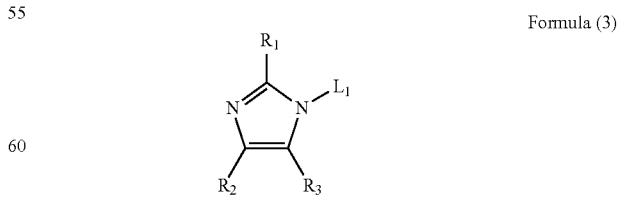

Exemplary compounds 2-1 to 2-3, and 2-12 are preferably used among exemplary compounds represented by Formula (2).

The compounds represented by Formula (2) may be easily obtained by synthesizing in accordance with the known preparation methods.

(Compound Having Structure Represented by Formula (3))

It is preferable that a second organic compound according to the present invention is a compound having structure represented by Formula (3). Hereafter, it is called as "Compound represented by Formula (3)".

2-12
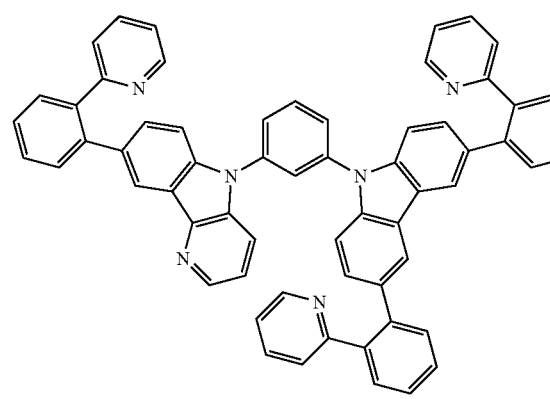

Formula (3)

$$\begin{array}{c} R_1 \\ \diagup \\ N \diagdown \\ \phantom{N} \diagdown N - L_1 \\ R_2 \phantom{XX} R_3 \end{array}$$

In Formula (3), $R_1$, $R_2$, and $R_3$ each independently represent a hydrogen atom or a substituent; and $L_1$ represents an aromatic hydrocarbon ring group or an aromatic heterocyclic group bonded to a nitrogen atom.

In Formula (3), examples of a substituent represented by $R_1$, $R_2$, and $R_3$ include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group, an allyl group); an alkynyl group (for example, an ethynyl group and a propargyl group); an aromatic hydrocarbon group (also called an aromatic hydrocarbon ring, an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyl group); an aromatic heterocyclic group (for example, a pyridyl group, a pyrazyl group, a pyrimidinyl group, a triazyl a group, a furyl group, a pyrrolyl group, an imidazolyl group, a benzimidazolyl group, a pyrazolyl group, a pyrazinyl group, a triazolyl group (for example, 1,2,4-triazol-1-yl group, and 1,2,3-triazol-1-yl group), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, an azacarbazolyl group (indicating a ring structure in which one of the carbon atoms constituting the carbazole ring of the carbazolyl group is replaced with nitrogen atoms), a quinoxalinyl group, a pyridazinyl group, a triazinyl group, a quinazolinyl group, and a phthalazinyl group); a heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethyl carbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group); an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group) and a phosphono group.

In Formula (3), $L_1$ has preferably an aromatic 6-membered ring structure. Examples of a preferable aromatic 6-membered ring structure include: an aromatic hydrocarbon group (also called an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyl group); and an aromatic heterocyclic group (also called a hetero aryl group, for example, a pyridyl group, a pyridazily group, a pyrimidyl group, a pyrazyl group, and a triazyl a group). In particular, $L_1$ has preferably a benzene ring structure or a triazine ring structure. Here, an aromatic 6-membered ring structure, a benzene ring structure or a triazine ring structure indicate that the group contains these structure as a partial structure in the same manner as the above-described pyridine ring structure.

Specific examples of a compound represented by Formula (3) according to the present invention are indicated below. However, the present invention is not limited to these exemplary compounds.

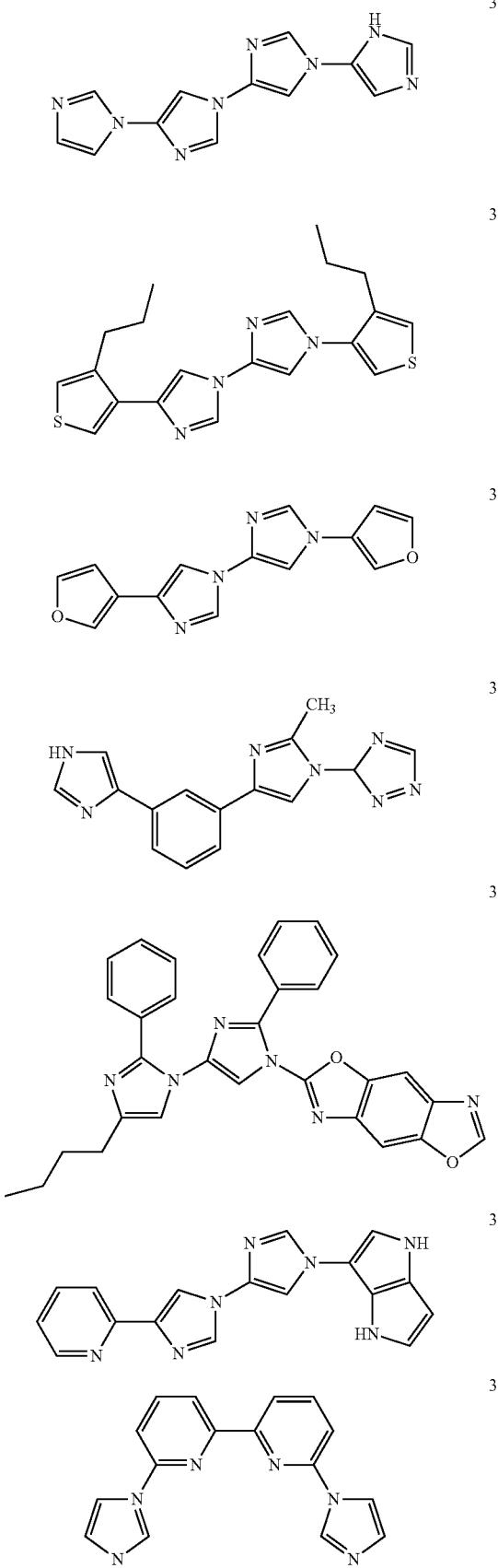
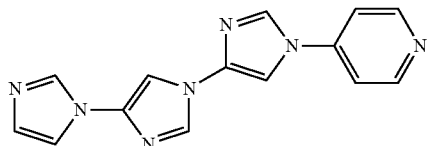
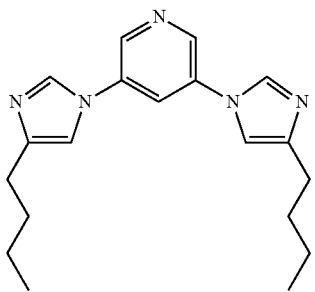
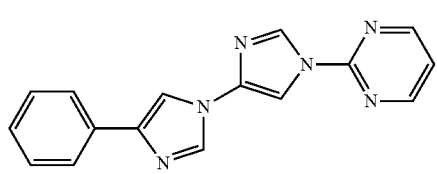
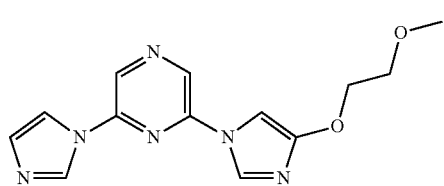
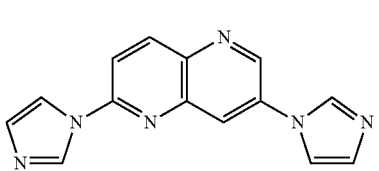
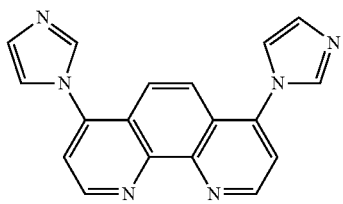
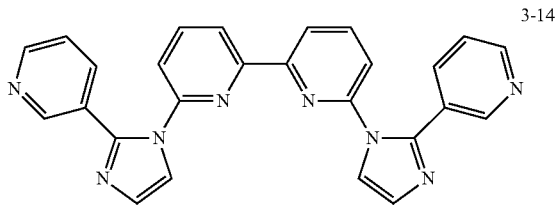

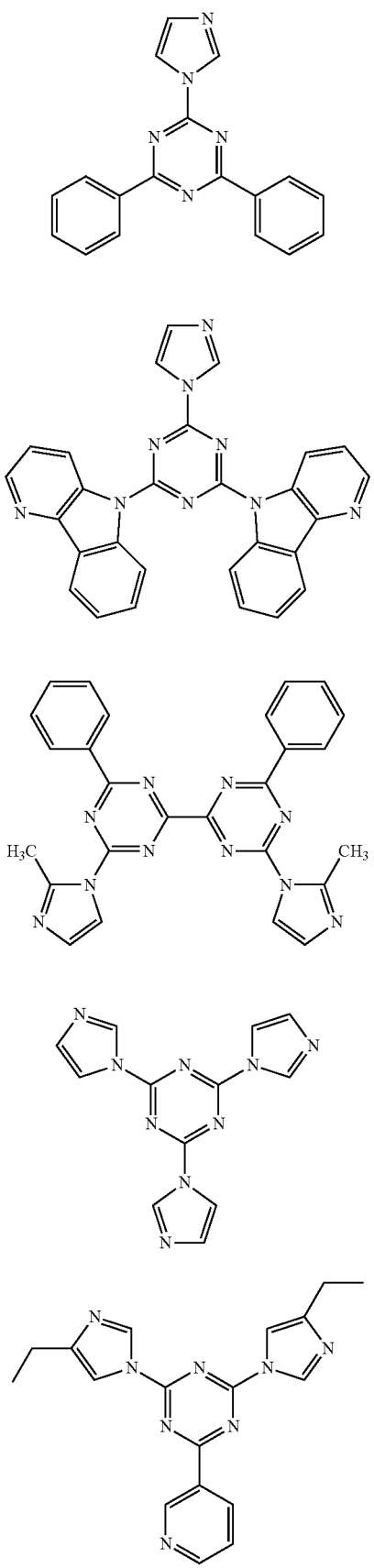
3-15
3-16
3-17
3-18
3-19
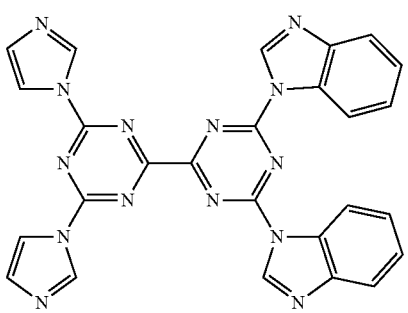
3-20
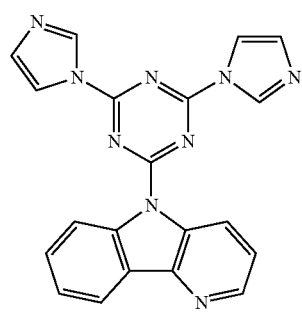
3-21
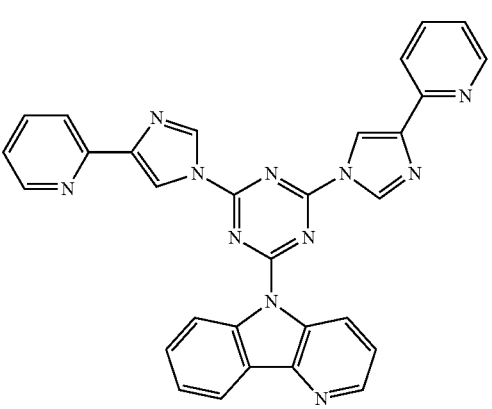
3-22
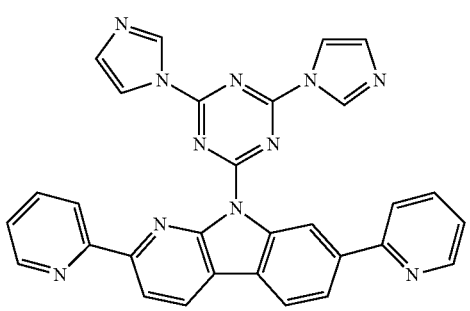
3-23

-continued

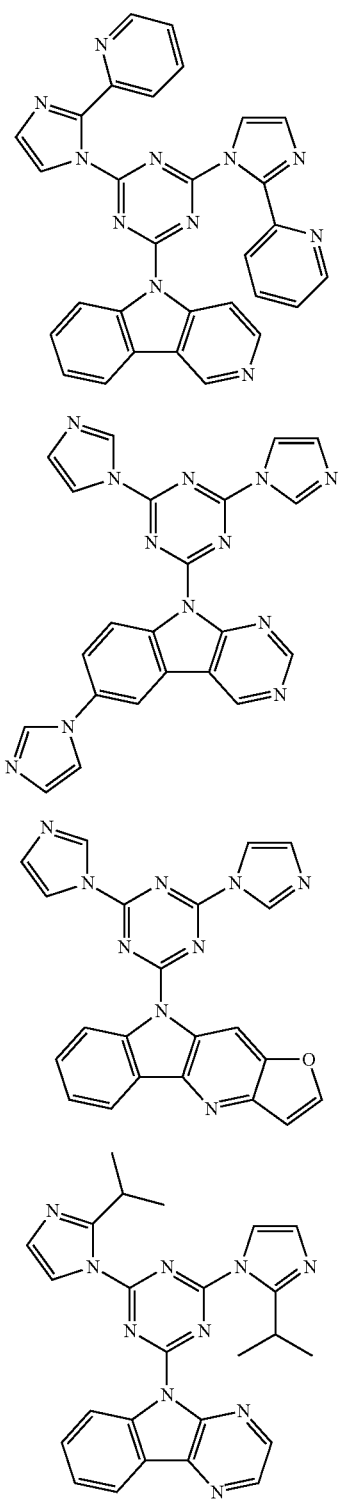

A compound represented by Formula (2) may be easily synthesized by conventional synthetic methods.
(Contained Ratio of Compound Represented by Formula (1) with Respect to Compound Represented by Formula (2) or Formula (3))

The organic functional layer of the present invention is characterized by containing the first organic compound represented by Formula (1) and the second organic compound having a different structure from a structure of the first organic compound. In addition, it is preferable to use the first organic compound represented by Formula (1) in combination with the second organic compound represented by Formula (2) or Formula (3).

In the present invention, a contained ratio of a compound represented by Formula (1) with respect to a compound represented by Formula (2) or Formula (3) is not limited in particular. However, the contained ratio of a compound represented by Formula (1) is preferably in the range of 5.0 to 60 mass % when the amount of the compound represented by Formula (2) or Formula (3) is 100 mass %. More preferably, it is in the range of 10 to 50 mass %.

(Forming Method of Organic Functional Layer)

Various thin film forming methods may be applied for forming an organic functional layer of the present invention. Among them, preferable forming methods are a vapor deposition method and a sputtering method. The vapor deposition methods applicable to the present invention include: a resistance heating deposition method, an electron beam deposition method, an ion plating method, an ion beam deposition method. As a vacuum deposition device, BMC-800T (made of Shincron Co. Ltd.) may be used, for example. Two heating boats are used. One of them is loaded with a compound represented by Formula (1), the other boat is loaded with a compound represented by Formula (2) or Formula (3). The heating condition is controlled to achieve a required contained ratio. An organic functional layer is formed by co-evaporation.

The sputtering method used for forming an organic functional layer of the present invention is done as follows. A metal for forming a thin film is placed as a target in a vacuum chamber. A rare gas element (usually argon) or nitrogen (usually derived from air) is hit to the target. The atoms on the surface of the target are flicked off to form a metal film of high density on a substrate. By introducing a reactive gas ($O_2$ or $N_2$) in the rare gas, it may be formed a film of a metal oxide or a metal nitride.

The sputtering methods applicable to the present invention include: a bipolar sputtering method, a magnetron sputtering method, a DC sputtering method, a DC pulse sputtering method, an RF (radio frequency) sputtering method, a dual magnetron sputtering method, a reactive sputtering method, an ion beam sputtering method, and a bias sputtering method. These known sputtering methods are suitably use.

As a commercial sputtering device, it may be cited: a magnetron sputtering device made of Osaka Vacuum Industrial Co. Ltd., various sputtering devices made of Ulvac Co. Ltd. (for example, Multi chamber sputtering device ENTRON™-EX W300), and a sputtering device L-430S-FHS made of ANELVA Co. Ltd.).

[Conductive Layer]

The conductive layer (12) according to the present invention contains silver as a main component. The conductive layer (12) is a layer formed on the above-described organic functional layer (11).

Although the conductive layer (12) is composed of silver as a main component, it may have a laminated structure composed of a plurality of layers according to necessity.

The conductive layer (12) preferably has a thickness in the range of 5 to 20 nm, more preferably in the range of 5 to 12 nm.

When the thickness is less than 20 nm, the absorption component or the reflection component of the layer will be small. This will lead to improved light transmittance, and this is preferable. When the thickness is larger than 5 nm, the conductivity in the conductive layer will be sufficient, and this is preferable.

The transparent electrode (10), having a laminate structure of the organic functional layer (11) and the conductive layer (12) formed thereon, may be covered with a protective film on the conductive layer (12). It may be laminated with another conductive layer. In this case, it is preferable that the protective film or the another conductive layer has light transmittance so as not deteriorating the light transmittance of the transparent electrode (10). In the transparent electrode (10) of the present invention, it may have a structure in which an optical adjusting layer (14) (as indicated in FIG. 2A and FIG. 2B) is disposed at the under portion of the transparent electrode (10), that is, between the organic functional layer (11) and the substrate (13) when needed.

The conductive layer (12) may be composed of an alloy containing silver (Ag) as a main component. Examples of the alloy include silver-magnesium (Ag—Mg), silver-copper (Ag—Cu), silver-palladium (Ag—Pd), silver-palladium-copper (Ag—Pd—Cu) and silver-indium (Ag—In).

Examples of a method for forming the conductive layer (12) include: wet processes such as an application method, an ink-jet method, a coating method, and a dipping method; a vapor deposition, and a sputtering method used for formation of the organic functional layer (11). Among them, it is preferable to use a vapor deposition method in the present invention. The vapor deposition methods applicable to the present invention include: a resistance heating deposition method, an electron beam deposition method, an ion plating method, and an ion beam deposition method. As a vacuum deposition device, BMC-800T (made of Shincron Co. Ltd.) may be used, for example.

By being formed on the organic functional layer (11) containing a specific compound, the conductive layer (12) of the present invention has sufficient conductivity without annealing at high temperature (for example, a heating process at 150° C. or more) after its formation. It may be subjected to annealing at high temperature after its formation when needed. In this case, it is necessary to set the temperature by considering the glass transition temperature (Tg) of the substrate constituting the transparent electrode.

The transparent electrode (10) having the structure as described above is provided with the conductive layer (12) composed of silver as a main component on the organic functional layer (11) containing the first organic compound represented by Formula (1) and the second organic compound. By this, when the conductive layer (12) is formed on the conductive layer (12), the silver atoms incorporated in the conductive layer (12) will interact with the first organic compound represented by Formula (1) and the second organic compound contained in the organic functional layer (11). As a result, the diffusion distance of the silver atoms on the surface of the organic functional layer (11) will be decreased, and aggregation of silver will be suppressed.

In general, in forming the conductive layer 1b composed of silver as a main component, thin-film growth is carried out in the nucleus growth mode (VW mode). Hence, silver particles are easily isolated in the shape of islands, and when the layer is thin, conductivity is difficult to obtain, and sheet resistance increases.

Therefore, in order to ensure conductivity, the layer needs to be thick. However, when the layer is thick, the light transmittance decreases, which is improper as a transparent electrode.

However, according to the transparent electrode (10) of the present invention, as described above, aggregation of silver on the organic functional layer (11) is prevented. Hence, in forming the conductive layer (12) composed of silver as a main component, thin-film growth is carried out in the layer growth mode (FW mode).

[Optical Adjusting Layer]

It is preferable that the transparent electrode of the present invention has an optical adjusting layer (14) containing a metal oxide or a metal sulfide between the substrate (13) and the organic functional layer (11), as indicated in FIG. 2A and FIG. 2B.

An optical adjusting layer (14) is a layer intended to adjust the optical characteristics such as the reflectance and the light transmittance of the conductive layer (12). The optical adjusting layer (14) is preferably a layer having a higher refractive index than the substrate (13). That is, it is preferably a high refractive index layer.

The refractive index of the high refractive index layer is preferably 1.8 or more, more preferably in the range of 2.1 to 2.5. When the refractive index of the high refractive index layer is higher than 1.8, the light transmittance of the conductive layer (12) tends to be enhanced. The refractive index of the high refractive index layer is preferably higher than the refractive index of the substrate (13) by an amount in the range of +0.1 to +1.1, more preferably by an amount in the range of +0.4 to +1.0. In the present invention, the refractive index of the high refractive index layer is a refractive index value with respect to light with a wavelength of 510 nm. It may be measured with an ellipsometer. The refractive index of the high refractive index layer may be adjusted by the materials composing the high refractive index layer or by the density of the materials in the high refractive index layer.

The high refractive index layer is preferably constituted by incorporating a dielectric material or an oxide semiconductor material. The material constituting the high refractive index layer is preferably a metal oxide or a metal sulfide. Examples of a metal oxide or a metal sulfide include: titanium oxide ($TiO_2$:n=2.1 to 2.4), indium tin oxide (abbreviation, ITO:n=1.9 to 2.2), zinc oxide (ZnO:n=1.9 to 2.0), zinc sulfide (ZnS:n=2.0 to 2.2), niobium oxide ($Nb_2O_5$: n=2.2 to 2.4), zirconium oxide ($ZrO_2$:n=2.0 to 2.1), cerium oxide ($CeO_2$:n=1.9 to 2.2), tantalum pentaoxide ($Ta_2O_5$: n=1.9 to 2.2), tin oxide ($SnO_2$:n=1.8 to 2.0), indium zinc oxide (abbreviation, IZO:n=1.9 to 2.4), zinc oxide (ZnO: n=1.9 to 2.0), and zinc sulfide (ZnS:n=2.2 to 2.4). From the viewpoint of refractive index and productivity, $TiO_2$, $Nb_2O_5$, ITO, and ZnO are preferable. The high refractive index layer may contain only one type of dielectric material or oxide semiconductor material, and it may include two or more kinds. The numerical value indicated by n in parentheses represents the refractive index.

A thickness of the high refractive index layer is preferably in the range of 10 to 100 nm, more preferably in the range of 20 to 50 nm. When the thickness of the high refractive index layer is larger than 10 nm, the light transmittance of the conductive layer (12) may be sufficiently enhanced. On the other hand, when the thickness of the high refractive index layer is smaller than 100 nm, the transparency (antireflectance) of the conductive layer (12) may be enhanced. The thickness of the high refractive index layer is measured with an ellipsometer.

The optical adjusting layer (14) may be a layer having a lower refractive index than the substrate (13). That is, it may be a low refractive index layer. Further, it may be provided with a low refractive index layer in addition to the above-described high refractive index layer. It may be made a plurality of laminated layers composed of the high refractive index layer and the low refractive index layer. By forming the low refractive index layer adjacent to the high refractive index layer, the light transmittance of the transparent electrode (10) is further enhanced.

As illustrated in FIG. 2B, it may be a constitution in which a first optical adjusting layer (14A) is disposed between the substrate (13) and the organic functional layer (11), and further, a second optical adjusting layer (14B) is disposed on the conductive layer (12). In this constitution, the first optical adjusting layer (14A) and the second optical adjusting layer (14B) may be the same composition or a different composition.

As a film forming method of the optical adjusting layer (14) on the substrate (11), it may be cited vapor deposition methods (resistance heating, or EB method) and sputtering methods. It is preferable that the selection of a vapor deposition method or a sputtering method is suitably done depending on the kinds of the used metal oxide and meal sulfide.

For example, when an optical adjusting layer is formed by using zinc oxide (ZnO), titanium oxide ($TiO_2$), or zinc sulfide (ZnS), a vapor deposition method is preferably applied. When an optical adjusting layer is formed by using indium oxide ($In_2O_3$), indium tin oxide (ITO), or niobium oxide ($Nb_2O_5$), a sputtering method is preferably applied.

«Uses of Transparent Electrode»

The transparent electrode of the present invention may be used for various electronic devices. Examples of the electronic devices include an organic EL element, an LED (Light Emitting Diode), a liquid crystal element, a solar battery and a touch panel. As an electrode member which requires optical transparency in each of these electronic devices, the transparent electrode of the present invention may be used.

«Application to Organic EL Element»

Hereinafter, as an example of the uses, embodiments of organic EL elements each using the transparent electrode of the present invention are described.

[First Embodiment of Organic EL Element]
[Structure of Organic EL Element]

FIG. 3 is a cross sectional view illustrating the structure of a first embodiment of an organic EL element using the transparent electrode (10) of the present invention as an example of an electronic device of the present invention.

Hereinafter, the structure of the organic EL element is described with reference to FIG. 3.

As illustrated in FIG. 3, an organic EL element (100) is disposed on a transparent substrate (13, it may be called as a base), and on the transparent substrate (13), it is disposed a transparent electrode (10) that is illustrated in FIG. 2A. On the transparent substrate that is a base (13) for the transparent electrode, there are laminated an optical adjusting layer (14), an organic functional layer (11) and a conductive layer (12). On this, there are laminated an organic light emitting layer unit (3) and a counter electrode (5a).

In this organic EL element (100), as the transparent electrode (10), the above-described transparent electrode of the present invention is used. Hence, the organic EL element (100) is configured to extract the generated emission light (L) from an emission point (h) at least from the light extraction face (13a) side of the transparent substrate (13).

An example of a layer structure of the organic EL element (100) is described below, however, it is not limited to this, and it may be a general layer structure. In FIG. 3, it is illustrated the constitution in which the transparent electrode (10) functions as an anode (i.e. a positive pole), and the counter electrode (5a) functions as a cathode (i.e. a negative pole).

In the constitution of FIG. 3, it is indicated a composition of the light emitting layer unit (3) having a layer structure of: a hole injection layer (3a), a hole transport layer (3b), a light emitting layer (3c), an electron transport layer (3d) and an electron injection layer (3e) stacked on the transparent electrode (10) as an anode in the order named. It is essential to have at least the light emitting layer (3c) made with an organic material. The hole injection layer (3a) and the hole transport layer (3b) may be provided as a hole transport/injection layer. The electron transport layer (3d) and the electron injection layer (3e) may be provided as an electron transport/injection layer. Further, in the light emitting layer unit (3), for example, the electron injection layer (3e) may be composed of an inorganic material.

In the light emitting layer unit (3), in addition to these layers, a hole blocking layer and an electron blocking layer may be disposed at their required positions when needed. Further, the light emitting layer (3c) may have a plurality of light emitting layers for different colors, the light emitting layers emit light of respective wavelength ranges, and may have a multilayer structure of these light emitting layers stacked with a non-luminescent auxiliary layer therebetween. The auxiliary layer may double as a hole blocking layer and an electron blocking layer. Further, the counter electrode (5a) as a cathode may also have a multilayer structure as needed. In the structure described above, only the portion where the light emitting layer unit (3) is interposed between the transparent electrode (10) and the counter electrode (5a) is a luminescent region in the organic EL element (100).

In the layer structure illustrated in FIG. 3, in order to reduce resistance of the transparent electrode (10), an auxiliary electrode (15) may be disposed in contact with the conductive layer (12) of the transparent electrode (10).

The organic EL element (100) configured as illustrated in FIG. 3 is sealed with a sealing member (17), which is described below, on the transparent substrate (13) in order to prevent deterioration of the light emitting layer unit (3) made with an organic material. The sealing member (17) is fixed to the transparent substrate (13) side with an adhesive (19). Terminal portions of the transparent electrode (10) and the counter electrode (5a) are disposed in such a way as to be exposed from the sealing member (17) while being insulated from each other by the light emitting layer unit (3) on the transparent substrate (13).

Hereinafter, the main layers of the above-described organic EL element (100) are detailed in the following order; the transparent substrate (13), the transparent electrode (10), the counter electrode (5a), the light emitting layer (3c) of the light emitting layer unit (3), other layers of the light emitting layer unit (3), the auxiliary electrode (15) and the sealing member (17).

(Transparent Substrate)

The transparent substrate (13) is a substrate (13) constituting the transparent electrode (10) of the present invention as described by referring to FIG. 1, FIG. 2A, and FIG. 2B. Among the above-described substrate (13), it is used a transparent substrate (13) which has a light transmitting property.

(Transparent Electrode (Anode))

The transparent electrode (10) is the above-described transparent electrode (10) of the present invention and configured in such a way that the optical adjusting layer (14), the organic functional layer (11), and a conductive layer (12) are formed on the transparent substrate (13) side in the order named. Especially here, the transparent electrode (10) functions as an anode, and the conductive layer (12) is a substantial anode.

(Counter Electrode (Cathode))

The counter electrode (5a) is an electrode layer which functions as a cathode for supplying electrons to the light emitting layer unit (3) and is composed of, for example, a metal, an alloy, an organic or inorganic conductive compound, or a mixture thereof. Examples thereof include: aluminum; silver; magnesium; lithium; magnesium/copper mixture; magnesium/silver mixture; magnesium/aluminum mixture; magnesium/indium mixture; indium; lithium/aluminum mixture; rare-earth metal; and oxide semiconductors, such as ITO, ZnO, $TiO_2$ and $SnO_2$.

The counter electrode (5a) may be produced by forming a thin film of any of the above-mentioned conductive materials by vapor deposition, sputtering or another method.

It is preferable that the sheet resistance of the counter electrode 5a be several hundred $\Omega/\square$ or less. The thickness is selected from normally a range from 5 nm to 5 μm, preferably a range from 5 nm to 200 nm.

When the organic EL element (100) is configured to extract emission light (L) from the counter electrode (5a) side too, the counter electrode (5a) may be composed of a conductive material having excellent optical transparency selected from the above-mentioned conductive materials.

(Light Emitting Layer)

The light emitting layer (3c) contains a luminescent material. In particular, it is preferable that it is a phosphorescence emitting dopant as a luminescent material. It may be called as a phosphorescence emitting material, a phosphorescence emitting compound, or a phosphorescence compound.

The light emitting layer (3c) is a layer which emits light through recombination of electrons injected from the electrode or the electron transport layer (3d) and holes injected from the hole transport layer (3b). A light emitting portion (h) may be either inside of the light emitting layer (3c) or an interface between the light emitting layer (3c) and its adjacent layer.

The structure of the light emitting layer (3c) is not particularly limited as long as the luminescent material contained therein satisfies a light emission requirement. Further, the light emitting layer (3c) may be composed of a plurality of layers having the same emission spectrum and maximum emission wavelength. In this case, it is preferable that non-luminescent auxiliary layer (not shown) is present in respective spaces between the light emitting layers (3c).

The total thickness of the light emitting layers (3c) is preferably within a range from 1 to 100 nm, and, in view of obtaining a lower driving voltage, more preferably within a range from 1 to 30 nm. The total thickness of the light emitting layers (3c) is, when the non-luminescent auxiliary layers are present between the light emitting layers (3c), the thickness is a value including the thickness of the intermediate layers.

When the light emitting layers (3c) has a multilayer structure of a plurality of layers stacked, it is preferable to adjust the thickness of each light emitting layer to be within a range from 1 to 50 nm, and more preferably to be within a range from 1 to 20 nm. When the stacked light emitting layers are for respective luminescent colors of blue, green and red, a relationship between the thickness of the luminescent layer for blue, the thickness of the luminescent layer for green and the thickness of the luminescent layer for red is not particularly limited.

The light emitting layers (3c) thus configured may be formed by forming a thin film of a luminescent material with a host compound, which are described below, by a well-known thin film forming method such as a vacuum deposition method, a spin coating method, a casting method, an LB method or an ink-jet method.

The light emitting layers (3c) may be composed of a mixture of a plurality of luminescent materials, or a mixture of a phosphorescence emitting dopant (a phosphorescence emitting compound) and a fluorescent dopant (also called a fluorescence emitting material or a fluorescent compound).

It is preferable that the light emitting layers (3c) contain a host compound (also called a luminescent host) and a luminescent material (also called a luminescent dopant) and emit light from the luminescent material.

(Host Compound)

The host compound contained in the light emitting layers (3c) is a compound exhibiting phosphorescence emission at room temperature (25° C.), preferably with a phosphorescence quantum yield of less than 0.1, and more preferably with a phosphorescence quantum yield of less than 0.01. Further, of the compounds contained in the light emitting layers (3c), a volume percentage of the host compound in the layer is preferably 50% or more.

As a host compound, one type of known host compounds may be used alone, or a plurality of types thereof may be used together. Use of a plurality of types of host compounds enables adjustment of transfer of charges, thereby increasing efficiency of the organic EL element. Further, use of a plurality of types of luminescent materials described below enables mixture of emission light of different colors, thereby producing any luminescent color.

The host compound to be used may be a known low molecular weight compound, a polymer having a repeating unit or a low molecular weight compound (a vapor deposition polymerizable luminescent host) having a polymerizable group such as a vinyl group or an epoxy group.

Of the known host compounds, it is preferable to use a compound which has a hole transport property and an electron transport property, prevents red shift and has a high Tg (glass transition temperature).

The glass transition temperature Tg here is a value obtained using DSC (Differential Scanning Colorimetry) by a method in conformity with JIS-K-7121-2012.

As specific examples of a known host compound, the compounds described in the following Documents are cited. Examples thereof are: Japanese patent application publication (JP-A) Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Further examples thereof are: US Patent Application Publication (US) Nos. 2003/0175553, 2006/0280965, 2005/0112407, 2009/0017330, 2009/0030202, 2005/0238919; WO 2001/039234, WO 2009/021126, WO 2008/056746, WO 2004/093 207, WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297, and EP 2034538.

(Luminescent Material)
(1) Phosphorescence Emitting Dopant

As a luminescent material applicable to the present invention, it is cited a phosphorescence emitting dopant.

The phosphorescence emitting dopant is a compound which is observed emission from an excited triplet state thereof. Specifically, it is a compound which emits phosphorescence at a room temperature (25° C.) and exhibits a phosphorescence quantum yield of at least 0.01 at 25° C. The phosphorescence quantum yield is preferably at least 0.1.

The phosphorescence quantum yield will be determined via a method described in page 398 of Bunko II of Dai 4 Han Jikken Kagaku Koza 7 (Spectroscopy II of 4th Edition Lecture of Experimental Chemistry 7) (1992, published by Maruzen Co. Ltd.). The phosphorescence quantum yield in a solution will be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescence emitting dopant are cited.

One is an energy transfer-type, wherein carriers recombine on a host compound on which the carriers are transferred to produce an excited state of the host compound, and then via transfer of this energy to a phosphorescent dopant, emission from the phosphorescence emitting dopant is realized.

The other is a carrier trap-type, wherein a phosphorescence emitting dopant serves as a carrier trap and then carriers recombine on the phosphorescent dopant to generate emission from the phosphorescent dopant. In each case, the excited state energy level of the phosphorescent dopant is required to be lower than that of the host compound.

The phosphorescence emitting dopant may be suitably selected from well-known compounds used for light emitting layers of usual organic EL elements. Preferably used compounds are a complex compound containing a metal of Groups 8 to 10 in the element periodic table, more preferably, an iridium compound, an osmium compound, a platinum compound (a platinum complex compound) or a rare-earth complex, and most preferably, an iridium compound.

In the present invention, at least one light emitting layer $3c$ may contain two or more types of phosphorescence emitting dopants, and a concentration ratio of the phosphorescence emitting dopants in the light emitting layer $3c$ may vary in a thickness direction of the light emitting layer $3c$.

It is preferable that the phosphorescence emitting dopant is contained in an amount of 0.1 vol % to 30 vol % with respect to the total amount of the light emitting layer(s) $3c$.

Examples of a known phosphorescence dopant are compounds described in the following publications.

Cited are phosphorescence dopants described in: Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/835469, US 2006/0202194, US 2007/0087321, US 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), and Inorg. Chem. 42, 1248 (2003).

Further cited are phosphorescence dopants in: WO 2009/050290, WO 2002/015645, WO 2009/000673, US 2002/0034656, U.S. Pat. No. 7,332,232, US 2009/0108737, US 2009/0039776, U.S. Pat. Nos. 6,921,915, 6,687,266, US 2007/0190359, US 2006/0008670, US 2009/0165846, US 2008/0015355, U.S. Pat. Nos. 7,250,226, 7,396,598, US 2006/0263635, US 2003/0138657, US 2003/0152802, and U.S. Pat. No. 7,090,928.

Further cited are phosphorescence dopants in: Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2005/123873, WO 2007/004380, WO 2006/082742, US 2006/0251923, US 2005/0260441, U.S. Pat. Nos. 7,393,599, 7,534,505, 7,445,855, US 2007/0190359, US 2008/0297033, U.S. Pat. No. 7,338,722, US 2002/0134984, and U.S. Pat. No. 7,279,704, US 2006/098120, US 2006/103874, WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, JP-A 2012-069737, JP Application No. 2011-181303, JP-A 2009-114086, JP-A 2003-81988, JP-A 2002-302671 and JP-A 2002-363552.

Among them, preferable phosphorescence dopants are organic metal complexes containing Ir as a center metal. More preferable are complexes containing at least one coordination mode selected from a metal-carbon bond, a metal-nitrogen bond, a metal-oxygen bond and a metal-sulfur bond.

(2) Fluorescence Dopant

A fluorescence emitting dopant according to the present invention will be described. Hereafter, it may be called as "a fluorescence dopant".

A fluorescence dopant according to the present invention is a compound which is observed emission from an excited singlet state thereof. The compound is not limited as long as emission from an excited singlet state is observed.

Examples of a fluorescent emitting dopant include: a coumarin dye, a pyran dye, a cyanine dye, a croconium dye, a squarium dye, an oxobenzanthracene dye, a fluorescein dye, a rhodamine dye, a pyrylium dye, a perylene dye, a stilbene dye, a polythiophene dye and a rare-earth complex phosphor.

In recent years, it was developed a light emitting dopant utilizing delayed fluorescence. It may use this dopant.

Specific examples of a light emitting dopant utilizing delayed fluorescence are compounds described in: WO 2011/156793, JP-A 2011-213643, and JP-A 2010-93181. However, the present invention is not limited to them.

(Injection Layer: Hole Injection Layer and Electron Injection Layer)

An injection layer is a layer which is arranged between an electrode and a light emitting layer $3c$ to decrease an driving voltage and to improve emission luminance. It is detailed in volume 2, chapter 2 "Electrode materials" (pp. 123-166) of "Organic EL Elements and Industrialization Front thereof (Nov. 30, 1998, published by N.T.S. Co. Ltd.)". Examples thereof include the hole injection layer ($3a$) and the electron injection layer ($3e$).

The injection layer may be provided when needed. In the case of the hole injection layer ($3a$), it may be placed between the anode and the light emitting layer ($3c$) or the hole transport layer ($3b$). In the case of the electron injection layer ($3e$), it may be placed between the cathode and the light emitting layer ($3c$) or the electron transport layer ($3d$).

The hole injection layer ($3a$) is also detailed in documents such as JP-A Nos. 9-45479, 9-260062 and 8-288069. Examples thereof include: a phthalocyanine layer of copper phthalocyanine, for example; an oxide layer of vanadium oxide, for example; an amorphous carbon layer; and a polymer layer using a conductive polymer such as polyaniline (emeraldine) or polythiophene.

The electron injection layer ($3e$) is also detailed in documents such as JP-A Nos. 6-325871, 9-17574 and 10-74586. Examples thereof include: a metal layer of strontium or aluminum, for example; an alkali metal halide layer of potassium fluoride, for example; an alkali earth metal compound layer of magnesium fluoride, for example; and an oxide layer of molybdenum oxide, for example. It is preferable that the electron injection layer ($3e$) of the present invention is a very thin film, and the thickness thereof is within a range from 1 nm to 10 μm although it depends on the material thereof.

(Hole Transport Layer)

The hole transport layer ($3b$) is composed of a hole transport material having a function to transporting holes, and, in a broad sense, the hole injection layer ($3a$) and the electron blocking layer are included in the hole transport layer ($3b$). The hole transport layer ($3b$) may be composed of a single layer or a plurality of layers.

The hole transport material is a material having either a property to inject or transport holes, or a barrier property against electrons. It may be either an organic material or an inorganic material. Examples thereof include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an oligomer of a conductive high polymer such as a thiophene oligomer.

As a hole transport material, those mentioned above may be used. However, it is preferable to use a porphyrin compound, an aromatic tertiary amine compound or a styrylamine compound, in particular an aromatic tertiary amine compound.

Representative examples of the aromatic tertiary amine compound and the styrylamine compound include: N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-metylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbezene; N-phenylcarbazole; those having two condensed aromatic rings in a molecule mentioned in U.S. Pat. No. 5,061,569, such as 4,4'-bis[N-(1-naphthyl)-N-phenylamino]biphenyl (NDP); and 4,4',4''-tris[N-(3-methylphenyl)-N-phenylamino]triphenylamine (MTDATA) in which three triphenylamine units are bonded in a star burst form mentioned in JP-A No. 4-308688.

Polymer materials which are introduced these materials into a polymer side chain or a polymer main chain may also be used. Inorganic compounds such as a p type-Si and a p type-SiC may also be used as the hole injection material and the hole transport material.

Further, it is possible to employ so-called p-type hole transport materials as described in documents of JP-A No. 11-251067, and J. Huang et al. Applied Physics Letters 80 (2002), p. 139. In the present invention, it is preferable to use these materials in view of producing a light emitting element having higher efficiency.

The hole transport layer ($3b$) may be produced by forming a thin film of any of the above-mentioned hole transport materials by a well-known method such as: vacuum deposition, spin coating, casting, printing including the ink jet method, or the LB method. The thickness of the hole transport layer ($3b$) is not particularly limited, but it is generally about 5 nm to 5 μm, preferably 5 to 200 nm. The hole transport layer ($3b$) may have a single-layer structure composed of one type or two or more types of the above-mentioned materials.

The material of the hole transport layer ($3b$) may be doped with impurities so that p-property increases. Examples thereof include those mentioned in documents such as JP-A Nos. 4-297076, 2000-196140 and 2001-102175 and J. Appl. Phys., 95, 5773 (2004).

Increase of p-property of the hole transport layer ($3b$) is preferable as it enables production of an organic EL element which consumes lower electric power.

(Electron Transport Layer)

The electron transport layer ($3d$) is composed of a material having a function to transport electrons, and, in a broad sense, the electron injection layer ($3e$) and the hole blocking layer are included in the electron transport layer ($3d$). The electron transport layer ($3d$) may have a single-layer structure or a multilayer structure of a plurality of layers.

The electron transport material (may have a role of a hole blocking material) which constitutes a layer portion adjacent to the light emitting layer ($3c$) in the electron transport layer ($3d$) having a single-layer structure or in the electron transport layer $3(d)$ having a multilayer structure should have a function of transporting electrons injected from the cathode to the light emitting layer ($3c$). The material to be used may be suitably selected from well-known compounds. Examples thereof include: a nitro-substituted fluorene derivative, a diphenylquinone derivative, a thiopyrandioxide derivative, carbodiimide, a fluorenylidenemethane derivative, anthraquinodimethane, an anthrone derivative, and an oxadiazole derivative. A thiadiazole derivative formed in a way that an oxygen atom of an oxadiazole ring of an oxadiazole derivative is substituted by a sulfur atom, and a quinoxaline derivative having a quinoxaline ring which is well-known as an electron withdrawing group may also be used as the material of the electron transport layer ($3d$). Further, polymer materials which are introduced these materials into a polymer side chain or a polymer main chain may also be used.

Further, metal complexes having a ligand of a 8-quinolinol structure or dibnenzoquinolinol structure such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the metal complexes is substituted by In, Mg, Cu, Ca, Sn, Ga or Pb, may be also utilized as a material of the electron transport layer ($3d$).

Further, a metal-free or metal phthalocyanine, or a compound whose terminal is substituted by an alkyl group or a sulfonic acid group, may be preferably utilized as a material of the electron transport layer ($3d$). A distyryl pyrazine derivative, which is exemplified as a material of the light emitting layer ($3c$), may be used as a material of the electron transport layer (3d). Further, in the same manner as used for a hole injection layer (3a) and a hole transport layer (3b), an inorganic semiconductor such as an n-type Si and an n-type SiC may be also utilized as a material of the electron transport layer (3d).

The electron transport layer (3d) may be produced by forming a thin film of any of the above-mentioned materials by a well-known method such as vacuum deposition, spin coating, casting, printing including the ink jet method, or the LB method. The thickness of the electron transport layer (3d) is not particularly limited, but it is generally about 5 nm to 5 µm, preferably 5 to 200 nm. The electron transport layer (3d) may have a single-layer structure composed of one type or two or more types of the above-mentioned materials.

The electron transport layer (3d) may be doped with impurities so that n-property increases. Examples thereof include those mentioned in documents such as JP-A Nos. 4-297076, 10-270172, 2000-196140 and 2001-102175 and J. Appl. Phys., 95, 5773 (2004). It is preferable that the electron transport layer (3d) contain potassium, or a potassium compound. An example of a potassium compound, potassium fluoride may be used. When n-property of the electron transport layer (3d) is increased, it enables to produce an element which consumes lower electric power.

As a material (electron transport compound) of the electron transport layer (3d), it may be used the same material for the above-mentioned organic functional layer (11) of the present invention. The same applies to the electron transport layer (3d) which doubles as the electron injection layer (3e).

(Blocking Layer: Hole Blocking Layer and Electron Blocking Layer]

The blocking layer is provided when needed in addition to the basic constituent layers of the above-described organic light emitting layer unit. Examples thereof include a hole blocking layer mentioned in documents such as JP-A Nos. 11-204258 and 11-204359 and p. 273 of "Organic EL Element and Front of Industrialization thereof (Nov. 30, 1998, published by N.T.S Co., Ltd.)".

The hole blocking layer has a function of the electron transport layer (3d) in a broad sense. The hole blocking layer is composed of a hole blocking material having a function to transport electrons with a significantly low property to transport holes, and it may increase recombination probability of electrons and holes by blocking holes while transporting electrons. The structure of the electron transport layer (3d) described above may be used as a hole blocking layer when needed. It is preferable that the hole blocking layer is disposed adjacent to the light emitting layer (3c).

On the other hand, the electron blocking layer has a function of the hole transport layer (3b) in a broad sense. The electron blocking layer is composed of a material having a function to transport holes with a significantly low property to transport electrons, and it may increase recombination probability of electrons and holes by blocking electrons while transporting holes. The structure of the hole transport layer (3b) described above may be used as an electron blocking layer when needed.

The thickness of the hole blocking layer is preferably in the range of 3 to 100 nm, and more preferably in the range of 5 to 30 nm.

(Auxiliary Electrode)

The auxiliary electrode (15) is provided in order to reduce resistance of the transparent electrode (10) and disposed in contact with the conductive layer (12) of the transparent electrode (10). As a material which forms the auxiliary electrode (15), a metal having low resistance is preferable. Examples thereof include gold, platinum, silver, copper and aluminum. Because these metals have low optical transparency, the auxiliary electrode (15) is formed by patterning within an extent not to be affected by extraction of emission light (L) from a light extraction face (13a). Examples of a method for forming the auxiliary electrode (15) include vapor deposition, sputtering, printing, ink jet method, and aerosol jet method. It is preferable that the line width of the auxiliary electrode (15) is 50 µm or less in view of an open area ratio to extract light, and the thickness of the auxiliary electrode (15) is 1 µm or more in view of conductivity.

(Sealing Member)

The sealing member (17) covers the organic EL element (100), and it may be a plate-type (film-type) sealing member and fixed to the transparent substrate (13) side with the adhesive (19) or may be a sealing layer. The sealing member (17) is disposed in such a way as to cover at least the light emitting layer unit (3) while exposing the terminal portions of the transparent electrode (10), in particular, the conductive layer (12) and the counter electrode (5a) of the organic EL element (100). The sealing member (17) may be provided with an electrode, and the terminal portions of the transparent electrode (10) and the counter electrode (5a) of the organic EL element (100) may be conductive with this electrode.

Examples of the plate-type (film-type) sealing member (17) include a glass substrate, a polymer substrate and a metal substrate. These substrate materials may be made to be thinner films to use. Examples of the glass substrate include, in particular, soda-lime glass, glass containing barium and strontium, lead glass, aluminosilicate glass, borosilicate glass, barium borosilicate glass and quartz. Examples of the polymer substrate include polycarbonate, acrylic, polyethylene terephthalate, polyether sulfide and polysulfone. Examples of the metal substrate include ones composed of at least one type of metals or alloys selected from the group consisting of stainless steel, iron, copper, aluminum, magnesium, nickel, zinc, chromium, titanium, molybdenum, silicon, germanium and tantalum.

In particular, a polymer substrate or a metal substrate in the shape of a thin film may be used by preference as the sealing member in view of making an element thin.

It is preferable that the film-type polymer substrate have an oxygen permeability of $1 \times 10^{-3}$ ml/(m²·24 h·atm) or less determined by a method in conformity with JIS K 7126-1987 and a water vapor permeability (at 25±0.5° C. and a relative humidity of 90±2% RH) of $1 \times 10^{-3}$ g/(m²·24 h) or less determined by a method in conformity with JIS K 7129-1992.

The above-mentioned substrate materials may be each processed to be in the shape of a concave plate to be used as the sealing member (17). In this case, the above-mentioned substrate materials are processed by sandblasting, or chemical etching to be concave.

The adhesive (19) for fixing the plate-type sealing member (17) to the transparent substrate (13) side is used as a sealing agent for sealing the organic EL element (100) which is sandwiched between the sealing member (17) and the transparent substrate (13). Examples of the adhesive (19) include: photo-curable and thermosetting adhesives of an acrylic acid oligomer or a methacrylic acid oligomer having a reactive vinyl group; and moisture-curable adhesives such as 2-cyanoacrylate.

Examples of the adhesive further include thermosetting and chemical curing (two-liquid-mixed) ones such as an epoxy type, hot-melt ones such as polyamide, polyester and polyolefin and yet further include cationic curing ones such as a UV-curable epoxy resin adhesive.

The organic compound constituting the organic EL element (100) is occasionally deteriorated by heat treatment. Therefore, the adhesive (19) is preferably one which is capable of adhesion and curing at from room temperature to 80° C. In addition, a desiccating agent may be dispersed into the adhesive (19).

The adhesive (19) may be applied to an adhesion portion of the sealing member (17) and the transparent substrate (13) with a commercial dispenser or may be printed in the same way as screen printing.

When spaces are formed between the plate-type sealing member (17), the transparent substrate (13) and the adhesive (19), it is preferable, in a gas phase and a liquid phase, to inject an inert gas, such as nitrogen or argon, and an inert liquid, such as fluorohydrocarbon or silicone oil, respectively, into the spaces. The spaces may be made to be a vacuum state, or a hygroscopic compound may be enclosed therein.

Examples of the hygroscopic compound include: metal oxide (for example, sodium oxide, potassium oxide, calcium oxide, barium oxide, magnesium oxide and aluminum oxide); sulfate (for example, sodium sulfate, calcium sulfate, magnesium sulfate and cobalt sulfate); metal halide (for example, calcium chloride, magnesium chloride, cesium fluoride, tantalum fluoride, cerium bromide, magnesium bromide, barium iodide and magnesium iodide); and perchlorate (for example, barium perchlorate and magnesium perchlorate). With respect to sulfate, metal halide and perchlorate, anhydrous salts are used by preference.

On the other hand, when a sealing layer is used as the sealing member (17), the sealing layer is disposed on the transparent substrate (13) in such a way as to completely cover the organic light emitting layer unit (3) of the organic EL element (100) and also to expose the terminal portions of the transparent electrode (10) and the counter electrode (5*a*) of the organic EL element 100.

The sealing layer is made with an inorganic material or an organic material, in particular a material impermeable to matters such as moisture and oxygen which cause deterioration of the organic light emitting layer unit (3) of the organic EL element (100). Examples of the material to be used include inorganic materials such as silicon oxide, silicon dioxide and silicon nitride. In order to reduce fragility of the sealing layer, the sealing layer may have a multilayer structure of a layer composed of any of these inorganic materials and a layer composed of an organic material.

A method for forming these layers is not particularly limited, and usable methods include vacuum deposition, sputtering, reactive sputtering, molecular beam epitaxy, cluster ion beam, ion plating, plasma polymerization, atmospheric pressure plasma polymerization, plasma. CVD, laser CVD, thermal CVD, and coating.

(Protective Layer and Protective Plate)

A protective layer or a protective plate may be disposed in such a way that the organic EL element (100) and the sealing member (17) are sandwiched between the protective layer or the protective plate and the transparent substrate (13). The protective layer or the protective plate is for mechanical protection of the organic EL element (100). When the sealing member (17) is a sealing layer in particular, it is preferable to provide the protective layer or the protective plate because mechanical protection of the organic EL element (100) is insufficient.

Usable materials for the protective layer or the protective plate include: a glass plate; a polymer plate and a polymer film thinner than that; a metal plate and a metal film thinner than that; a polymer material layer; and a metal material layer. In particular, it is preferable to use a polymer film as it is light and thin.

(Production Method of Organic EL Element)

A production method of the organic EL element (100) illustrated in FIG. 3 is described herein as an example.

First, an optical adjusting layer (14) containing a metal oxide or a metal sulfide is formed on a transparent substrate (13) by a suitable method such as vapor deposition or sputtering to have a thickness of 10 to 100 nm. On this layer was formed an organic functional layer (11) containing a first organic compound represented by Formula (1) and a second organic compound by a method such as vapor deposition to have a thickness of 10 to 100 nm. Next, a conductive layer (12) composed of silver (or an alloy containing silver) is formed on the organic functional layer (11) by a method such as vapor deposition to have a thickness of 5 to 20 nm, preferably 8 to 12 nm. Thus, a unit of transparent electrode (10) to become an anode is produced.

Next, a hole injection layer (3*a*), a hole transport layer (3*b*), a light emitting layer (3*c*), an electron transport layer (3*d*), and an electron injection layer (3*e*) are formed on this in the order named, thereby forming an organic light emitting layer unit (3). These layers may be formed by spin coating, casting, the ink jet method, vapor deposition, or printing. However, the vacuum deposition and the spin coating are particularly preferable because, for example, they tend to produce homogeneous layers and hardly generate pinholes. Further, different forming methods may be used to form the respective layers. When the vapor deposition is employed to form these layers, although the vapor deposition conditions differ depending on the type of compounds to use, it is generally preferable that the conditions be suitably selected from their respective ranges of: 50° C. to 450° C. for a boat heating temperature; $1 \times 10^{-6}$ Pa to $1 \times 10^{-2}$ Pa for degree of vacuum; 0.01 to 50 nm/sec for a deposition rate; −50 to 300° C. for a substrate temperature; and 0.1 to 5 μm for thickness.

After the organic light emitting layer unit (3) is formed in the above-described manner, a counter electrode (5*a*) as a cathode is formed on the upper side thereof by a suitable forming method such as vapor deposition or sputtering. At this time, the counter electrode (5*a*) is formed by patterning to be a shape of being lead from the upper side of the organic light emitting layer unit (3) to the periphery of the transparent substrate (13), the terminal portion of the counter electrode (5*a*) being on the periphery of the transparent substrate (13), while being insulated from the transparent electrode (10) by the organic light emitting layer unit (3). Thus, the organic EL element (100) is obtained. After that, a sealing member (17) is disposed in such a way as to cover at least the organic light emitting layer unit (3) while exposing the terminal portions of the transparent electrode (10) and the counter electrode (5*a*) of the organic EL element (100).

Thus, a required organic EL element is formed on a transparent substrate (13). In production of an organic EL element (100), it is preferable to produce layers from an organic light emitting layer unit (3) to a counter electrode (5*a*) altogether by one vacuum drawing. However, the transparent substrate (13) may be taken out from the vacuum atmosphere halfway and another forming method may be carried out. In this case, consideration should be given, for example, to doing works under a dry inert gas atmosphere.

When a DC voltage is applied to the organic EL element (100) thus obtained, light emission is observed by application of a voltage of about 2 to 40 V with the transparent electrode (10) as an anode being the positive polarity and the counter electrode (5a) as a cathode being the negative polarity. Alternatively, an AC voltage may be applied thereto. The waveform of the AC voltage to be applied is arbitrary.

[Effects of Organic EL Element]

The organic EL element (100) in the first embodiment described above uses the transparent electrode (10) of the present invention having both conductivity and optical transparency as an anode. It has a structure provided with the light emitting layer unit (3) and the counter electrode (5a) as a cathode on the upper side of the transparent electrode (10). Hence, the organic EL element (100) can emit light with high luminance by application of a sufficient voltage to the space between the transparent electrode (10) and the counter electrode (5a). It can further increase the luminance by increase of extraction efficiency of emission light (L) from the transparent electrode (10) side, and it can extend emission lifetime by reduction of the driving voltage for obtaining desired luminance.

[Second Embodiment of Organic EL Element]
[Structure of Organic EL Element]

FIG. 4 is a schematic cross-sectional view illustrating an organic EL element of a second embodiment using the above-described transparent electrode (10) as an example of an electronic device of the present invention. Difference between an organic EL element (200) of the second embodiment illustrated in FIG. 4 and the organic EL element (100) of the first embodiment described with reference to FIG. 3 is that the organic EL element (200) uses a transparent electrode (10) as a cathode.

Detailed description about components which are the same as those of the first embodiment is not repeated, and components specific to the organic EL element (200) of the second embodiment are described below.

As illustrated in FIG. 4, the organic EL element (200) is disposed on a transparent substrate (13), and as with the first embodiment, it uses the above-described transparent electrode (10) of the present invention as a transparent electrode (10) disposed on the transparent substrate (13). Hence, the organic EL element (200) is configured to extract emission light (L) at least from the transparent substrate (13) side. Note that the transparent electrode (10) is used as a cathode (negative pole). Accordingly, a counter electrode (5b) is used as an anode.

The layer structure of the organic EL element (200) thus configured is not limited to the below-described examples and hence may be a general layer structure, which is the same as the first embodiment.

As an example thereof for the second embodiment, there is indicated a layer structure of an electron injection layer (3e), an electron transport layer (3d), a light emitting layer (3c), a hole transport layer (3b), and a hole injection layer (3a) laminated on the upper side of the transparent electrode (10), which functions as a cathode, in the order named. It is essential to have, among them, at least the light emitting layer (3c) composed of an organic material.

In addition to these layers, as described in the first embodiment, the light emitting layer unit (3) employs various components as needed. In the structure described above, only the portion where the light emitting layer unit (3) interposed between the transparent electrode (10) and the counter electrode (5b) is a luminescent region in the organic EL element (200), which is also the same as the first embodiment.

Further, in the above-described layer structure, in order to reduce resistance of the transparent electrode (10), an auxiliary electrode (15) may be disposed in contact with the conductive layer (12) of the transparent electrode (10), which is also the same as the first embodiment.

The counter electrode (5b) used as an anode is composed of, for example, a metal, an alloy, an organic or inorganic conductive compound, or a mixture thereof. Examples thereof include: metals, such as gold (Au); copper iodide (CuI); and oxide semiconductors, such as ITO, ZnO, $TiO_2$ and $SnO_2$.

The counter electrode (5b) thus configured may be produced by forming a thin film of any of the above-mentioned conductive materials by vapor deposition, sputtering or another method.

It is preferable that the sheet resistance of the counter electrode (5b) is several hundred Ω/□ or less. The thickness is selected from normally a range from 5 nm to 5 μm, preferably a range from 5 nm to 200 nm.

When the organic EL element (200) is configured to extract emission light (L) from the counter electrode (5b) side too, as a material of the counter electrode (5b), a conductive material having excellent optical transparency to be used is selected from the above-mentioned conductive materials.

The organic EL element (200) thus configured is, as with the first embodiment, sealed with a sealing member (17) in order to prevent deterioration of the light emitting layer unit (3).

Detailed structure of the main layers constituting the above-described organic EL element (200) except for the counter electrode (5b) used as an anode and a production method of the organic EL element (200) are the same as those of the first embodiment. Hence, detailed description thereof is omitted.

[Effects of Organic EL Element]

The above-described organic EL element (200) uses the transparent electrode (10) of the present invention having both conductivity and optical transparency as a cathode, and it has a structure provided with the light emitting layer unit (3) and the counter electrode (5b) as an anode on the upper side of the transparent electrode (10). Hence, the organic EL element (200) can emit light with high luminance by application of a sufficient voltage to a space between the transparent electrode (10) and the counter electrode (5b), it can further increase the luminance by increase of extraction efficiency of emission light (L) from the transparent electrode (10) side and can extend emission lifetime by reduction of the driving voltage for obtaining desired luminance.

«Uses of Organic EL Element»

The organic EL element that is an example of an electronic device as described above is a surface emitting body, hence it may be used for various light sources. Examples thereof are not limited to but include illumination devices such as a household light and an interior light of a car, backlights of a timepiece and a liquid crystal device, a light of a signboard, a light source of a signal, a light source of an optical storage medium, a light source of an electrophotographic copier, a light source of a device for processing in optical communications and a light source of an optical sensor. The organic EL element may be effectively used for, in particular, a backlight of a crystal liquid display device which is combined with a color filter or a light source for illumination.

The organic EL element of the present invention may be used for a sort of lamp, such as a light source for illumination or a light source for exposure, or may be used for a projection device which projects images or a direct-view display device of still images and moving images. In this case, with recent increase in size of illumination devices and displays, a luminescent face may be enlarged by two-dimensionally connecting, namely, tiling, luminescent panels provided with organic EL elements thereof.

A driving system used for a display device for moving image playback may be a simple matrix (passive matrix) system or an active matrix system. Further, use of two or more types of organic EL elements of the present invention having different luminescent colors enables production of a color or full-color display device.

In the following, an illumination device of the present invention will be described as an example of the applications.

[Application of Organic EL Element to Illumination Device]

An illumination device of the present invention may be prided with the above-described organic EL element.

The organic EL element used for an illumination device of the present invention may be designed as an organic EL element having any one of the above-described structures and a resonator structure. Although not limited thereto, the organic EL element configured to have a resonator structure is intended to be used for a light source of an optical storage medium, a light source of an electrophotographic copier, a light source of a device for processing in optical communications and a light source of an optical sensor. The organic EL element may be used for the above-mentioned uses by being configured to carry out laser oscillation.

The materials used for the organic EL element of the present invention are applicable to an organic EL element which emits substantially white light (also called a white organic EL element). For example, white light may be obtained by simultaneously emitting light of different luminescent colors with luminescent materials and mixing the luminescent colors. A combination of luminescent colors may be one containing three maximum emission wavelengths of three primary colors of red, green and blue or one containing two maximum emission wavelengths utilizing a relationship of complementary colors, such as blue and yellow or blue-green and orange.

A combination of luminescent materials to obtain a plurality of luminescent colors may be a combination of a plurality of phosphorescent or fluorescent materials or a combination of a phosphorescent or fluorescent material and a pigment material which emits light with light from the phosphorescent or fluorescent material as excitation light. In a white organic EL element, a plurality of luminescent dopants may be combined and mixed.

Unlike a structure to obtain white light by disposing organic EL elements which emit light of different colors in an array form, this kind of white organic EL element itself emits white light. Hence, most of all the layers constituting the element do not require masks when formed. Consequently, for example, an electrode layer may be formed on the entire surface by vapor deposition, casting, spin coating, the ink jet method, or printing, and accordingly productivity increases.

EXAMPLES

Hereafter, the present invention will be described specifically by referring to examples, however, the present invention is not limited to them. In examples, the indication of "%" is used. Unless particularly mentioned, it represents "mass %".

Example 1

«Production of Transparent Electrode»

As described below, transparent electrodes 101 to 121 each were produced in such a way that an area of a conductive region was 5 cm×5 cm.

[Production of Transparent Electrode 1]

A substrate composed of transparent alkali-free glass (having a thickness of 0.5 μm, in Tables 1 and 2, it is indicated simply "glass") was fixed to a substrate holder of a vacuum deposition device (BMC-800T made of Shincron Co. Ltd.), and the substrate holder was mounted in a vacuum tank of the vacuum deposition device. In addition, silver (Ag) was placed in a tungsten resistance heating boat, and the heating boat was mounted in the vacuum tank. Next, after the pressure of the vacuum tank was reduced to $4 \times 10^{-4}$ Pa, the resistance heating boat was electrically heated. Thus, a transparent electrode 1 having a single-layer structure composed of silver having a thickness of 10 nm was formed on the base at a deposition rate of 0.1 nm/sec to 0.2 nm/sec.

[Production of Transparent Electrode 2]

A transparent electrode 2 having a single-layer structure was produced in the same manner as production of the above-described transparent electrode 1 except that the substrate was changed from the alkali-free glass to a polyethylene terephthalate film (having a thickness of 100 μm, in Table 1, it is indicated as "PET").

[Production of Transparent Electrode 3]

A transparent electrode 3 having a single-layer structure was produced in the same manner as production of the above-described transparent electrode 1 except that the substrate was changed from the alkali-free glass to a polyethylene naphthalate film (having a thickness of 100 μm, in Table 1, it is indicated as "PEN").

[Production of Transparent Electrode 4]

A transparent electrode 4 having a single-layer structure was produced in the same manner as production of the above-described transparent electrode 1 except that an optical adjusting layer 1 was formed with a vacuum deposition method described below between the substrate and the conductive layer 1.

(Formation of Optical Adjusting Layer 1)

As a vacuum deposition device, BMC-800T (made of Shincron Co. Ltd.) was used. $TiO_2$ was placed in a tungsten resistance heating boat. After the pressure of the vacuum tank was reduced to $1 \times 10^{-4}$ Pa, the resistance heating boat was electrically heated. The electric heating condition of the resistance heating boat was controlled, and deposition was made at a deposition rate of 2.0 nm/sec to form an optical adjusting layer 1 composed of $TiO_2$ having a thickness of 30 nm.

[Production of Transparent Electrode 5]

A transparent electrode 5 was produced in the same manner as production of the above-described transparent electrode 1 except that an optical adjusting layer 2 was formed with a sputtering method described below between the substrate and the conductive layer 1.

(Formation of Optical Adjusting Layer 2)

A sputtering device L-430S-FHS (made of Anelva Co. Ltd.) was used. $Nb_2O_5$ was RC sputtered to form a layer thickness of 30 nm under the conditions of, Ar: 20 sccm, $O_2$: 5 sccm, sputtering pressure: 0.25 Pa, at room temperature (25° C.), forming rate: 0.74 Å/sec. Thus an optical adjusting layer 2 having a thickness of 30 nm was formed. The distance between the target and the substrate was 86 mm.

[Production of Transparent Electrode 6]

A transparent electrode 6 was produced in the same manner as production of the above-described transparent electrode 5 except that $Nb_2O_5$ was replaced with ITO (indium tin oxide) as an optical adjusting layer forming material. An optical adjusting layer 3 was formed with a sputtering method to have a thickness of 30 nm.

[Production of Transparent Electrode 7]

A transparent electrode 7 was produced in the same manner as production of the above-described transparent electrode 5 except that $Nb_2O_5$ was replaced with IZO (indium zinc oxide) as an optical adjusting layer forming material. An optical adjusting layer 4 was formed with a sputtering method to have a thickness of 30 nm.

[Production of Transparent Electrode 8]

A transparent electrode 8 was produced in the same manner as production of the above-described transparent electrode 4 except that $TiO_2$ was replaced with ZnO as an optical adjusting layer forming material. An optical adjusting layer 5 was formed with a vacuum deposition method to have a thickness of 30 nm.

[Production of Transparent Electrode 9]

A transparent electrode 9 was produced in the same manner as production of the above-described transparent electrode 4 except that $TiO_2$ was replaced with ZnS as an optical adjusting layer forming material. An optical adjusting layer 6 was formed with a vacuum deposition method to have a thickness of 30 nm.

[Production of Transparent Electrode 10]

A transparent electrode 10 was produced in the same manner as production of the above-described transparent electrode 1 except that an organic functional layer 1 having a thickness of 15 nm was formed with a vacuum deposition method described below between the substrate and the conductive layer 1.

(Formation of Organic Functional Layer 1)

As a vacuum deposition device, BMC-800T (made of Shincron Co. Ltd.) was used. An exemplary compound (1-1) represented by Formula (1) was placed in a tungsten resistance heating boat. After the pressure of the vacuum tank was reduced to $1 \times 10^{-4}$ Pa, the resistance heating boat was electrically heated. The electric heating condition of the resistance heating boat was controlled, and deposition was made at a deposition rate of 0.1 nm/sec to form an organic functional layer 1 composed of the exemplary compound (1-1) having a thickness of 15 nm.

[Production of Transparent Electrodes 11 to 15]

Transparent electrodes 11 to 15 were produced in the same manner as production of the above-described transparent electrode 10 except that the exemplary compound (1-1) used for a forming material of an organic functional layer was changed with the exemplary compound described in Table 1. The optical adjusting layers 2 to 6 were formed with a vacuum deposition method to have a thickness of 15 nm.

[Production of Transparent Electrode 16]

A transparent electrode 16 was produced in the same manner as production of the above-described transparent electrode 10 except that the forming method of the organic functional layer was changed to a co-deposition method as described below to form an organic functional layer 7 having a thickness of 15 nm.

(Formation of Organic Functional Layer 7)

As a vacuum deposition device, BMC-800T (made of Shincron Co. Ltd.) was used. Two tungsten resistance heating boats were placed. In one tungsten resistance heating boat was placed an exemplary compound (1-1) represented by Formula (1). In the other tungsten resistance heating boat was placed an exemplary compound (2-2) represented by Formula (2).

After the pressure of the vacuum tank was reduced to $1 \times 10^{-4}$ Pa, the resistance heating boats were respectively electrically heated. The electric heating conditions of the resistance heating boats were controlled so that the deposition rates of the exemplary compound (1-1) and the exemplary compound (2-2) were made to have a ratio of 15:100. Thus it was formed an organic functional layer 7 having a thickness of 15 nm.

[Production of Transparent Electrodes 17 to 20]

Transparent electrodes 17 to 20 were produced in the same manner as production of the above-described transparent electrode 16 except that a forming material of an organic functional layer was changed with the combination of the compounds described in Table 1. Organic functional layers 8 to 11 were formed with a co-vacuum deposition method to have a thickness of 15 nm.

[Production of Transparent Electrodes 21 and 22]

Transparent electrodes 21 and 22 were produced in the same manner as production of the above-described transparent electrode 16 except that the substrate was respectively changed from glass to PET or PEN.

[Production of Transparent Electrodes 23 and 24]

Transparent electrodes 23 and 24 were produced in the same manner as production of the above-described transparent electrode 19 except that the substrate was respectively changed from glass to PET or PEN.

[Production of Transparent Electrodes 25 to 39]

Transparent electrodes 25 to 39 were produced in the same manner as production of the above-described transparent electrode 16 except that a forming material of an organic functional layer was changed with the combination of the compounds described in Table 1 and Table 2. Organic functional layers 14 to 28 were formed with a co-vacuum deposition method to have a thickness of 15 nm.

[Production of Transparent Electrodes 40 to 45]

Transparent electrodes 40 to 45 were produced in the same manner as production of the above-described transparent electrodes 4 to 9 except that the organic functional layer 7 was placed between the optical adjusting layers 1 to 6 and the conductive layer 1.

[Production of Transparent Electrodes 46 to 51]

Transparent electrodes 46 to 51 were produced in the same manner as production of the above-described transparent electrodes 4 to 9 except that the organic functional layer 10 was placed between the optical adjusting layers 1 to 6 and the conductive layer 1.

[Production of Transparent Electrode 52]

A transparent electrode 52 was produced in the same manner as production of the above-described transparent electrode 41 except that a conductive layer 2 described below was formed in place of the conductive layer 1.

(Formation of Conductive Layer 2)

As a vacuum deposition device, BMC-800T (made of Shincron Co. Ltd.) was used. Two tungsten resistance heating boats were placed. In one tungsten resistance heating boat was placed Ag. In the other tungsten resistance heating boat was placed Pd.

After the pressure of the vacuum tank was reduced to $1 \times 10^{-4}$ Pa, the resistance heating boats were respectively electrically heated. The electric heating conditions of the resistance heating boats were controlled so that the deposition rates of Ag and Pd were made to have a ratio of 90:10. Thus it was formed a conductive layer 2 having a thickness of 10 nm.

[Production of Transparent Electrode 53]

A transparent electrode 53 was produced in the same manner as production of the above-described transparent electrode 41 except that a conductive layer 3 described below was formed in place of the conductive layer 1.

(Formation of Conductive Layer 3)

As a vacuum deposition device, BMC-800T (made of Shincron Co. Ltd.) was used. Two tungsten resistance heating boats were placed. In one tungsten resistance heating boat was placed Ag. In the other tungsten resistance heating boat was placed Au.

After the pressure of the vacuum tank was reduced to $1 \times 10^{-4}$ Pa, the resistance heating boats were respectively electrically heated. The electric heating conditions of the resistance heating boats were controlled so that the deposition rates of Ag and Au were made to have a ratio of 90:10. Thus it was formed a conductive layer 3 having a thickness of 10 nm.

[Production of Transparent Electrode 54]

A transparent electrode 54 was produced in the same manner as production of the above-described transparent electrode 41 except that a conductive layer 4 described below was formed in place of the conductive layer 1.

(Formation of Conductive Layer 4)

As a vacuum deposition device, BMC-800T (made of Shincron Co. Ltd.) was used. Two tungsten resistance heating boats were placed. In one tungsten resistance heating boat was placed Ag. In the other tungsten resistance heating boat was placed Cu.

After the pressure of the vacuum tank was reduced to $1 \times 10^{-4}$ Pa, the resistance heating boats were respectively electrically heated. The electric heating conditions of the resistance heating boats were controlled so that the deposition rates of Ag and Cu were made to have a ratio of 90:10. Thus it was formed a conductive layer 4 having a thickness of 10 nm.

[Production of Transparent Electrodes 55 to 59]

Transparent electrodes 55 to 59 were produced in the same manner as production of the above-described transparent electrode 41 except that the constituting ratio of the exemplary compound (1-1) and the exemplary compound (2-2) in the formation of the conductive layer was changed as the ratio described in Table 2.

«Evaluation of Transparent Electrode»

[Measurement of Light Transmittance]

The light transmittance of the produced transparent electrodes was measured with a spectrophotometer (U-3300 manufactured by Hitachi High-Technologies Co. Ltd.). The substrate of each transparent electrode was used as a reference. The light transmittance at measuring wavelength of 550 nm was measured.

The sheet resistance ($\Omega/\square$) of the produced transparent electrodes was measured using a resistivity meter (MCP-T610 manufactured by Mitsubishi Chemical Analytics Co. Ltd.) by a 4-pin probe method and constant-current method.

The obtained results are listed in Table 1 (1-1 and 1-2) and Table 2 (2-1 and 2-2).

TABLE 1

| Transparent electrode No. | Substrate Material | Optical adjusting layer |  |  | Organic functional layer |  |  |  |  |  | Conductive layer |  |  | Evaluation result |  | Remarks |
|---|---|---|---|---|---|---|---|---|---|---|---|---|---|---|---|---|
|  |  | No. | Metal oxide | Thickness (nm) | No. | Formula (1) compound | Formula (2) compound | Formula (3) compound | *1 (Mass %) | Thickness (nm) | No. | Forming metal | Thickness (nm) | Transmittance (%) | Sheet resistance (Ω□) |  |
| 1 | Glass | — | — | — | — | — | — | — | — | — | 1 | Ag | 10 | 36 | >100 | Comp. |
| 2 | PET | — | — | — | — | — | — | — | — | — | 1 | Ag | 10 | 35 | >100 | Comp. |
| 3 | PEN | — | — | — | — | — | — | — | — | — | 1 | Ag | 10 | 35 | >100 | Comp. |
| 4 | Glass | 1 | TiO$_2$ | 30 | — | — | — | — | — | — | 1 | Ag | 10 | 40 | >100 | Comp. |
| 5 | Glass | 2 | Nb$_2$O$_5$ | 30 | — | — | — | — | — | — | 1 | Ag | 10 | 39 | >100 | Comp. |
| 6 | Glass | 3 | ITO | 30 | — | — | — | — | — | — | 1 | Ag | 10 | 37 | >100 | Comp. |
| 7 | Glass | 4 | IZO | 30 | — | — | — | — | — | — | 1 | Ag | 10 | 37 | >100 | Comp. |
| 8 | Glass | 5 | ZnO | 30 | — | — | — | — | — | — | 1 | Ag | 10 | 38 | >100 | Comp. |
| 9 | Glass | 6 | ZnS | 30 | — | — | — | — | — | — | 1 | Ag | 10 | 39 | >100 | Comp. |
| 10 | Glass | — | — | — | 1 | Compound 1-1 | — | — | — | 15 | 1 | Ag | 10 | 57 | 10.1 | Comp. |
| 11 | Glass | — | — | — | 2 | — | Compound 2-2 | — | — | 15 | 1 | Ag | 10 | 60 | 9.3 | Comp. |
| 12 | Glass | — | — | — | 3 | — | Compound 2-3 | — | — | 15 | 1 | Ag | 10 | 59 | 8.0 | Comp. |
| 13 | Glass | — | — | — | 4 | — | Compound 2-1 | — | — | 15 | 1 | Ag | 10 | 56 | 8.0 | Comp. |
| 14 | Glass | — | — | — | 5 | — | — | Compound 3-1 | — | 15 | 1 | Ag | 10 | 60 | 8.0 | Comp. |
| 15 | Glass | — | — | — | 6 | — | — | Compound 3-9 | — | 15 | 1 | Ag | 10 | 60 | 8.0 | Comp. |
| 16 | Glass | — | — | — | 7 | Compound 1-1 | Compound 2-2 | — | 15 | 15 | 1 | Ag | 10 | 68 | 5.4 | Inv. |
| 17 | Glass | — | — | — | 8 | Compound 1-1 | Compound 2-3 | — | 15 | 15 | 1 | Ag | 10 | 68 | 5.7 | Inv. |
| 18 | Glass | — | — | — | 9 | Compound 1-1 | Compound 2-1 | — | 15 | 15 | 1 | Ag | 10 | 67 | 5.5 | Inv. |

TABLE 1-continued

| Transparent electrode No. | Substrate Material | Optical adjusting layer Metal oxide No. | Optical adjusting layer Thickness (nm) | Organic functional layer Formula (1) compound | Organic functional layer Formula (2) compound | Organic functional layer Formula (3) compound | *1 (Mass %) | Thickness (nm) | Conductive layer No. | Conductive layer Forming metal | Conductive layer Thickness (nm) | Evaluation result Transmittance (%) | Evaluation result Sheet resistance (Ω/□) | Remarks |
|---|---|---|---|---|---|---|---|---|---|---|---|---|---|---|
| 19 | Glass | — | — | 10 Compound 1-1 | — | Compound 3-1 | 15 | 15 | 1 | Ag | 10 | 67 | 5.7 | Inv. |
| 20 | Glass | — | — | 11 Compound 1-1 | — | Compound 3-9 | 15 | 15 | 1 | Ag | 10 | 67 | 5.7 | Inv. |
| 21 | PET | — | — | 7 Compound 1-1 | Compound 2-2 | — | 15 | 15 | 1 | Ag | 10 | 66 | 6.0 | Inv. |
| 22 | PEN | — | — | 7 Compound 1-1 | Compound 2-2 | — | 15 | 15 | 1 | Ag | 10 | 66 | 6.1 | Inv. |
| 23 | PET | — | — | 12 Compound 1-1 | — | Compound 3-1 | 15 | 15 | 1 | Ag | 10 | 67 | 6.1 | Inv. |
| 24 | PEN | — | — | 13 Compound 1-1 | — | Compound 3-1 | 15 | 15 | 1 | Ag | 10 | 66 | 6.1 | Inv. |
| 25 | Glass | — | — | 14 Compound 1-1 | Compound 2-8 | — | 15 | 15 | 1 | Ag | 10 | 65 | 6.1 | Inv. |
| 26 | Glass | — | — | 15 Compound 1-1 | Compound 2-1 | — | 15 | 15 | 1 | Ag | 10 | 65 | 6.1 | Inv. |
| 27 | Glass | — | — | 16 Compound 1-1 | Compound 2-12 | — | 15 | 15 | 1 | Ag | 10 | 65 | 6.1 | Inv. |
| 28 | Glass | — | — | 17 Compound 1-1 | Compound 2-16 | — | 15 | 15 | 1 | Ag | 10 | 65 | 6.1 | Inv. |
| 29 | Glass | — | — | 18 Compound 1-1 | — | Compound 3-2 | 15 | 15 | 1 | Ag | 10 | 64 | 6.2 | Inv. |
| 30 | Glass | — | — | 19 Compound 1-1 | — | Compound 3-13 | 15 | 15 | 1 | Ag | 10 | 63 | 6.2 | Inv. |

*1: Dope density = Added amount (mass %) of Formula (1) compound with respect to Formula (2) compound or Formula (3) compound
Comp. = Comparative example
Inv. = Inventive example

TABLE 2

| Transparent electrode No. | Substrate Material | Optical adjusting layer | | | Organic functional layer | | | | | | | Conductive layer | | | Evaluation result | | Remarks |
|---|---|---|---|---|---|---|---|---|---|---|---|---|---|---|---|---|---|
| | | No. | Metal oxide | Thickness (nm) | No. | Formula (1) compound | Formula (2) compound | Formula (3) compound | *1 (Mass %) | Thickness (nm) | | No. | Forming metal | Thickness (nm) | Transmittance (%) | Sheet resistance (Ω□) | |
| 31 | Glass | — | — | — | 20 | Compound 1-1 | — | Compound 3-17 | 15 | 15 | | 1 | Ag | 10 | 64 | 6.2 | Inv. |
| 32 | Glass | — | — | — | 21 | Compound 1-1 | — | Compound 3-21 | 15 | 15 | | 1 | Ag | 10 | 64 | 6.2 | Inv. |
| 33 | Glass | — | — | — | 22 | Compound 1-1 | — | Compound 3-23 | 15 | 15 | | 1 | Ag | 10 | 64 | 6.2 | Inv. |
| 34 | Glass | — | — | — | 23 | Compound 1-2 | Compound 2-2 | — | 15 | 15 | | 1 | Ag | 10 | 66 | 5.7 | Inv. |
| 35 | Glass | — | — | — | 24 | Compound 1-3 | Compound 2-2 | — | 15 | 15 | | 1 | Ag | 10 | 65 | 5.9 | Inv. |
| 36 | Glass | — | — | — | 25 | Compound 1-6 | Compound 2-2 | — | 15 | 15 | | 1 | Ag | 10 | 67 | 5.6 | Inv. |
| 37 | Glass | — | — | — | 26 | Compound 1-2 | — | Compound 3-1 | 15 | 15 | | 1 | Ag | 10 | 65 | 5.9 | Inv. |
| 38 | Glass | — | — | — | 27 | Compound 1-3 | — | Compound 3-1 | 15 | 15 | | 1 | Ag | 10 | 64 | 6.0 | Inv. |
| 39 | Glass | — | — | — | 28 | Compound 1-6 | — | Compound 3-1 | 15 | 15 | | 1 | Ag | 10 | 66 | 5.9 | Inv. |
| 40 | Glass | 1 | TiO$_2$ | 30 | 7 | Compound 1-1 | Compound 2-2 | — | 15 | 15 | | 1 | Ag | 10 | 69 | 5.3 | Inv. |
| 41 | Glass | 2 | Nb$_2$O$_5$ | 30 | 7 | Compound 1-1 | Compound 2-2 | — | 15 | 15 | | 1 | Ag | 10 | 71 | 5.4 | Inv. |
| 42 | Glass | 3 | ITO | 30 | 7 | Compound 1-1 | Compound 2-2 | — | 15 | 15 | | 1 | Ag | 10 | 71 | 5.4 | Inv. |
| 43 | Glass | 4 | IZO | 30 | 7 | Compound 1-1 | Compound 2-2 | — | 15 | 15 | | 1 | Ag | 10 | 70 | 5.5 | Inv. |
| 44 | Glass | 5 | ZnO | 30 | 7 | Compound 1-1 | Compound 2-2 | — | 15 | 15 | | 1 | Ag | 10 | 69 | 5.4 | Inv. |
| 45 | Glass | 6 | ZnS | 30 | 7 | Compound 1-1 | Compound 2-2 | — | 15 | 15 | | 1 | Ag | 10 | 71 | 5.5 | Inv. |

TABLE 2-continued

| Transparent electrode No. | Substrate Material | Optical adjusting layer | | | Organic functional layer | | | | | | Conductive layer | | Evaluation result | | Remarks |
|---|---|---|---|---|---|---|---|---|---|---|---|---|---|---|---|
| | | No. | Metal oxide | Thickness (nm) | No. | Formula (1) compound | Formula (2) compound | Formula (3) compound | *1 (Mass %) | Thickness (nm) | No. | Forming metal | Thickness (nm) | Transmittance (%) | Sheet resistance (Ω/□) | |
| 46 | Glass | 1 | TiO₂ | 30 | 10 | Compound 1-1 | — | Compound 3-1 | 15 | 15 | 1 | Ag | 10 | 69 | 5.5 | Inv. |
| 47 | Glass | 2 | Nb₂O₅ | 30 | 10 | Compound 1-1 | — | Compound 3-1 | 15 | 15 | 1 | Ag | 10 | 70 | 5.6 | Inv. |
| 48 | Glass | 3 | ITO | 30 | 10 | Compound 1-1 | — | Compound 3-1 | 15 | 15 | 1 | Ag | 10 | 70 | 5.5 | Inv. |
| 49 | Glass | 4 | IZO | 30 | 10 | Compound 1-1 | — | Compound 3-1 | 15 | 15 | 1 | Ag | 10 | 69 | 5.6 | Inv. |
| 50 | Glass | 5 | ZnO | 30 | 10 | Compound 1-1 | — | Compound 3-1 | 15 | 15 | 1 | Ag | 10 | 68 | 5.4 | Inv. |
| 51 | Glass | 6 | ZnS | 30 | 10 | Compound 1-1 | — | Compound 3-1 | 15 | 15 | 1 | Ag | 10 | 70 | 5.6 | Inv. |
| 52 | Glass | 2 | Nb₂O₅ | 30 | 7 | Compound 1-1 | Compound 2-2 | — | 15 | 15 | 2 | AgPd | 10 | 71 | 5.2 | Inv. |
| 53 | Glass | 2 | Nb₂O₅ | 30 | 7 | Compound 1-1 | Compound 2-2 | — | 15 | 15 | 3 | AgAu | 10 | 71 | 5.1 | Inv. |
| 54 | Glass | 2 | Nb₂O₅ | 30 | 7 | Compound 1-1 | Compound 2-2 | — | 15 | 15 | 4 | AgCu | 10 | 69 | 5.1 | Inv. |
| 55 | Glass | 2 | Nb₂O₅ | 30 | 29 | Compound 1-1 | Compound 2-2 | — | 5 | 15 | 1 | Ag | 10 | 70 | 5.7 | Inv. |
| 56 | Glass | 2 | Nb₂O₅ | 30 | 30 | Compound 1-1 | Compound 2-2 | — | 10 | 15 | 1 | Ag | 10 | 71 | 5.5 | Inv. |
| 57 | Glass | 2 | Nb₂O₅ | 30 | 31 | Compound 1-1 | Compound 2-2 | — | 30 | 15 | 1 | Ag | 10 | 71 | 5.4 | Inv. |
| 58 | Glass | 2 | Nb₂O₅ | 30 | 32 | Compound 1-1 | Compound 2-2 | — | 50 | 15 | 1 | Ag | 10 | 70 | 5.2 | Inv. |
| 59 | Glass | 2 | Nb₂O₅ | 30 | 33 | Compound 1-1 | Compound 2-2 | — | 60 | 15 | 1 | Ag | 10 | 68 | 5.2 | Inv. |

*1: Dope density = Added amount (mass %) of Formula (1) compound with respect to Formula (2) compound or Formula (3) compound
Inv. = Inventive example As clearly indicated from the results described in Table 1 and Table 2, the transparent electrodes having a constitution of the present invention have excellent properties of light transmittance and sheet resistance. They achieve both properties together.

Example 2

«Production of Organic EL Device»

[Production of Organic EL Device 1]

An organic EL device 1 was produced in accordance with the following method by employing the transparent electrode 1 prepared in Example 1.

The transparent electrode 1 prepared in Example 1 was fixed to a substrate holder of a commercial vacuum deposition device, and a vapor deposition mask was disposed in such a way as to face a formation face of the transparent electrode 1. Further, the heating boats in the vacuum deposition device were filled with materials of respective layers constituting a light emitting layer unit (3) with their respective amounts optimal to form the layers. The heating boats used were composed of a tungsten material for resistance heating.

Next, the pressure of a vapor deposition room of the vacuum deposition device was reduced to $4 \times 10^{-4}$ Pa, and the heating boats having the respective materials therein were electrically heated successively so that the layers were formed as described below.

First, the heating boat having therein α-NPD (4,4'-Bis[phenyl(1-naphthyl)amino]-1,1'-biphenyl) as a hole transport/injection material was electrically heated. Thus, a hole transport/injection layer composed of α-NPD and functioning as both a hole injection layer and a hole transport layer was formed on the conductive layer (12) of the transparent electrode 1. At this time, the deposition rate was 0.1 nm/sec to 0.2 nm/sec, and the thickness was 20 nm.

Next, the heating boat having therein a host material H4 and the heating boat having therein a phosphorescent compound Ir-4 were independently electrified. Thus, a light emitting layer (3c) containing the host material H4 and the phosphorescent compound Ir-4 was formed on the hole transport/injection layer. At this time, the electrification of the heating boats was adjusted in such a way that the deposition rate of the host material H4: the deposition rate of the phosphorescent compound Ir-4=100:6. In addition, the thickness was 30 nm.

Next, the heating boat having therein BAlq (Bis(2-methyl-8-quinolinolate)-4-(phenylphenolato)aluminium) as a hole blocking material was electrically heated. Thus, a hole blocking layer composed of BAlq was formed on the light emitting layer (3c). At this time, the deposition rate was 0.1 nm/sec to 0.2 nm/sec, and the thickness was 10 nm.

After that, the heating boats having therein ET-6 and potassium fluoride, respectively, as electron transport materials were independently electrified. Thus, an electron transport layer (3d) containing ET-6 and potassium fluoride was formed on the hole blocking layer. At this time, the electrification of the heating boats was adjusted in such a way that the deposition rate of ET-6: the deposition rate of potassium fluoride=75:25. In addition, the thickness was 30 nm.

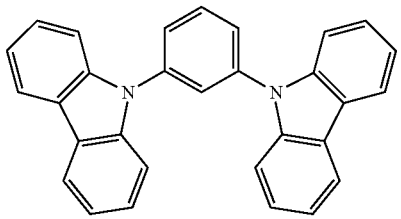

H4

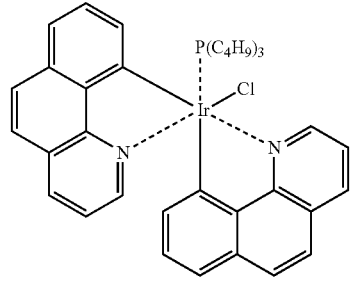

Ir-4

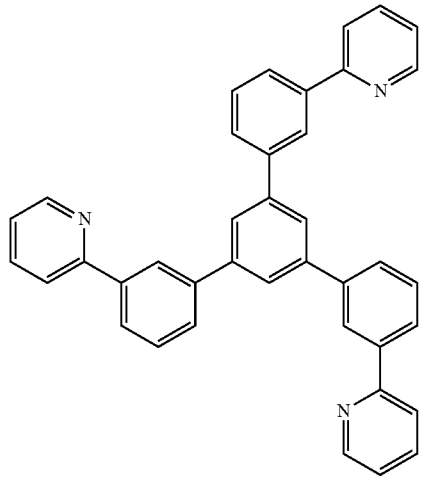

ET-6

Next, the heating boat having therein potassium fluoride as an electron injection material was electrically heated. Thus, an electron injection layer (3e) composed of potassium fluoride was formed on the electron transport layer (3d). At this time, the deposition rate was 0.01 nm/sec to 0.02 nm/sec, and the thickness was 1 nm.

After that, the transparent substrate (13) on which the layers up to the electron injection layer (3e) had been formed was transferred from the vapor deposition room of the vacuum deposition device into a treatment room of a sputtering device, the treatment room in which an ITO target as a counter electrode material had been placed, keeping its vacuum state. Next, in the treatment room, an optically transparent counter electrode (5a) composed of ITO having a thickness of 150 nm was formed at a deposition rate of 0.3 nm/sec to 0.5 nm/sec as a cathode. Thus, an organic EL element (100) was formed on the transparent substrate (13).

After that, the organic EL element was covered with a sealing member (17) composed of a glass substrate having a thickness of 300 μm, and the space between the sealing member (17) and the transparent substrate (13) was filled with an adhesive (19) (a sealing material) in a state in which the sealing member (17) and the transparent substrate (13) enclosed the organic EL element (100). As the adhesive (19), an epoxy-based photo-curable adhesive (LUXTRAK LC0629B produced by Toagosei Co., Ltd.) was used. The adhesive (19), with which the space between the sealing member (17) and the transparent substrate (13) was filled, was irradiated with UV light from the glass substrate (sealing member (17)) side, thereby being cured, so that the organic EL element (100) was sealed.

Thus, an organic EL panel 1 was produced by disposing the organic EL element (100) on the transparent substrate (13) and by sealing with the sealing member (17) and the adhesive (19).

[Production of Organic EL Devices 2 to 59]

Organic EL devices 2 to 59 were produced in the same manner as production of the above-described organic EL device 1 except that the transparent electrodes 2 to 59 prepared in Example 1 were used in place of the transparent electrode 1.

«Evaluation of Organic EL Device»

Driving voltage and color shift of the produced organic EL devices were measured in accordance with the methods described below.

[Measurement of Driving Voltage]

The measurement of driving voltage was done by measuring the voltage with which the front luminance on the transparent substrate side (13) of the organic EL device was made to be 1000 cd/m². This voltage was determined as the driving voltage. The luminance was measured with a spectroradiometer CS-2000 (manufactured by Konica Minolta Inc.). The smaller the obtained value of the driving voltage is, the more favorable result it means.

[Measurement of Color Shift]

The measurement of color shift was done: by applying an electric current of 2.5 mA/cm² to the organic EL device; and then, by measuring the chromaticity in CIE 1931 color coordinate system from the positions at different viewing angle.

The chromaticity was measured at 0 degree position (being a normal direction to the emitting surface of the transparent substrate (13) side, and at 45 degree positions with respect to the horizontal and vertical (the left, right, top and bottom) directions. The difference of chromaticity between the positions having a different angle was determined as a color shift (Δxy). The color shift represents a viewing angle property of the chromaticity. The smaller the obtained value is, the more favorable result it means.

The obtained results by these evaluation are listed in Table 3 and Table 4.

TABLE 3

| Organic EL device No. | Transparent electrode No. | Driving voltage (V) | Color shift (Δxy) | Remarks |
|---|---|---|---|---|
| 1 | 1 | Not lighted (cannot be evaluated) | | Comparative example |
| 2 | 2 | Not lighted (cannot be evaluated) | | Comparative example |
| 3 | 3 | Not lighted (cannot be evaluated) | | Comparative example |
| 4 | 4 | Not lighted (cannot be evaluated) | | Comparative example |
| 5 | 5 | Not lighted (cannot be evaluated) | | Comparative example |

TABLE 3-continued

| Organic EL device No. | Transparent electrode No. | Driving voltage (V) | Color shift (Δxy) | Remarks |
|---|---|---|---|---|
| 6 | 6 | Not lighted (cannot be evaluated) | | Comparative example |
| 7 | 7 | Not lighted (cannot be evaluated) | | Comparative example |
| 8 | 8 | Not lighted (cannot be evaluated) | | Comparative example |
| 9 | 9 | 6.0 | 0.10 | Comparative example |
| 10 | 10 | 5.9 | 0.08 | Comparative example |
| 11 | 11 | 5.7 | 0.06 | Comparative example |
| 12 | 12 | 5.8 | 0.09 | Comparative example |
| 13 | 13 | 5.8 | 0.09 | Comparative example |
| 14 | 14 | 5.7 | 0.09 | Comparative example |
| 15 | 15 | 5.8 | 0.09 | Comparative example |
| 16 | 16 | <5.0 | <0.03 | Inventive example |
| 17 | 17 | 5.1 | 0.03 | Inventive example |
| 18 | 18 | 5.1 | 0.03 | Inventive example |
| 19 | 19 | 5.2 | 0.03 | Inventive example |
| 20 | 20 | 5.2 | 0.03 | Inventive example |
| 21 | 21 | <5.0 | <0.03 | Inventive example |
| 22 | 22 | <5.0 | <0.03 | Inventive example |
| 23 | 23 | <5.0 | <0.03 | Inventive example |
| 24 | 24 | <5.0 | <0.03 | Inventive example |
| 25 | 25 | <5.0 | <0.03 | Inventive example |
| 26 | 26 | <5.0 | <0.03 | Inventive example |
| 27 | 27 | <5.0 | <0.03 | Inventive example |
| 28 | 28 | <5.0 | <0.03 | Inventive example |
| 29 | 29 | <5.0 | <0.03 | Inventive example |
| 30 | 30 | <5.0 | <0.03 | Inventive example |

TABLE 4

| Organic EL device No. | Transparent electrode No. | Driving voltage (V) | Color shift (Δxy) | Remarks |
|---|---|---|---|---|
| 31 | 31 | <5.0 | <0.03 | Inventive example |
| 32 | 32 | <5.0 | <0.03 | Inventive example |
| 33 | 33 | <5.0 | <0.03 | Inventive example |
| 34 | 34 | 5.2 | 0.04 | Inventive example |
| 35 | 35 | 5.2 | 0.04 | Inventive example |
| 36 | 36 | 5.2 | 0.04 | Inventive example |
| 37 | 37 | 5.3 | 0.03 | Inventive example |
| 38 | 38 | 5.3 | 0.03 | Inventive example |
| 39 | 39 | 5.3 | 0.03 | Inventive example |
| 40 | 40 | <5.0 | <0.03 | Inventive example |
| 41 | 41 | <5.0 | <0.03 | Inventive example |
| 42 | 42 | <5.0 | <0.03 | Inventive example |
| 43 | 43 | <5.0 | <0.03 | Inventive example |
| 44 | 44 | <5.0 | <0.03 | Inventive example |
| 45 | 45 | <5.0 | <0.03 | Inventive example |
| 46 | 46 | 5.0 | 0.03 | Inventive example |
| 47 | 47 | 5.0 | 0.03 | Inventive example |
| 48 | 48 | 5.0 | 0.03 | Inventive example |
| 49 | 49 | 5.0 | 0.03 | Inventive example |
| 50 | 50 | 5.0 | 0.03 | Inventive example |
| 51 | 51 | 5.0 | 0.03 | Inventive example |
| 52 | 52 | <5.0 | <0.03 | Inventive example |
| 53 | 53 | <5.0 | <0.03 | Inventive example |
| 54 | 54 | <5.0 | <0.03 | Inventive example |
| 55 | 55 | 5.4 | <0.03 | Inventive example |
| 56 | 56 | <5.0 | <0.03 | Inventive example |
| 57 | 57 | <5.0 | <0.03 | Inventive example |
| 58 | 58 | <5.0 | <0.03 | Inventive example |
| 59 | 59 | <5.0 | 0.06 | Inventive example |

As clearly indicated from the results described in Table 3 and Table 4, the organic EL devices provided with the transparent electrode the present invention may be driven with a small voltage and exhibits a small amount of color shift compared with a comparative example.

INDUSTRIAL APPLICABILITY

The transparent electrode of the present invention is provided with excellent light transmittance and high conductivity. It may be used for an electronic device with low driving voltage and excellent in color shift. Further, it may be effectively used for illumination devices such as a household light and an interior light of a car, backlights of a timepiece and a liquid crystal device, a light of a signboard, a light source of a signal, a light source of an optical storage medium, a light source of an electrophotographic copier, a light source of a device for processing in optical communications and a light source of an optical sensor.

DESCRIPTION OF SYMBOLS

3: Organic light emitting layer unit
3a: Hole injection layer
3b: Hole transport layer
3c: Light emitting layer
3d: Electron transport layer
3e: Electron injection layer
5a: Counter electrode
11: Organic functional layer
12: Conductive layer
13: Substrate (Transparent substrate)
14, 14A, and 14B: Optical adjusting layer
13a: Light extraction face
15: Auxiliary electrode
17: Sealing agent
19: Adhesive
100 and 200: Organic EL element
h: Light emitting portion
L: Emission light

The invention claimed is:

1. An organic electroluminescent element provided with a transparent electrode, the transparent electrode comprising a substrate having thereon a conductive layer containing silver as a main component,
wherein the transparent electrode has an organic functional layer between the substrate and the conductive layer, the organic functional layer is adjacent to the conductive layer, and a light emitting layer unit is not formed between the substrate and the conductive layer; and
the organic functional layer contains a first organic compound represented by Formula (1) and a second organic compound having a different structure from a structure of the first organic compound,

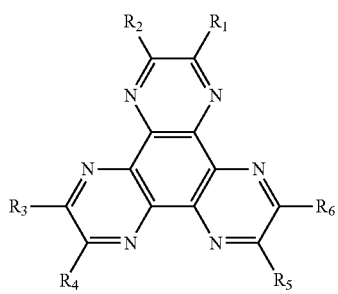

Formula (1)

wherein $R_1$ to $R_6$ each independently represent: a hydrogen atom, a halogen atom, a cyano group, a nitro group, a sulfonyl group ($-SO_2R^7$), a sulfinyl group ($-SOR^7$), a sulfonamide group ($-SO_2NR^7R^8$), a sulfonate group ($-SO_3R^7$), a trifluoromethyl group, an ester group ($-COOR^7$), an amide group ($-CONHR^7$ or $-CONR^7R^8$), an alkyl group of 1 to 12 carbon atoms, an alkoxy group of 1 to 12 carbon atoms, an aromatic hydrocarbon ring group, an arylamino group, a non-aromatic heterocyclic group, an aromatic heterocyclic group, or an aralkylamino group; $R^7$ and $R^8$ each independently represent an alkyl group of 1 to 60 carbon atoms, an aryl group, or a 5 to 7 membered heterocyclic group.

2. The organic electroluminescent element described in claim 1,
wherein the second organic compound contained in the organic functional layer is a compound represented by Formula (2) or Formula (3),

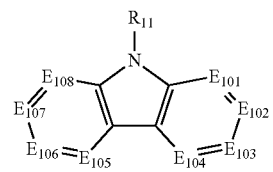

Formula (2)

wherein $E_{101}$ to $E_{108}$ each represent $C(R_{12})$ or a nitrogen atom, and at least one of $E_{101}$ to $E_{108}$ represents a nitrogen atom; and $R_{11}$ and $R_{12}$ each represent a hydrogen atom or a substituent,

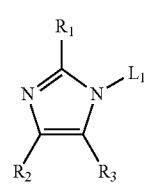

Formula (3)

wherein $R_1$, $R_2$, and $R_3$ each independently represent a hydrogen atom or a substituent; and $L_1$ represents an aromatic hydrocarbon ring group or an aromatic heterocyclic group bonded to a nitrogen atom.

3. The organic electroluminescent element described in claim 1,
wherein the first organic compound represented by Formula (1) has $R_1$ to $R_6$ all being a cyano group.

4. The organic electroluminescent element described in claim 1,
wherein the transparent electrode has an optical adjusting layer containing a metal oxide or a metal sulfide between the substrate and the organic functional layer.

* * * * *